(12) United States Patent
Ohshima

(10) Patent No.: US 7,905,397 B2
(45) Date of Patent: Mar. 15, 2011

(54) DATA MANAGEMENT METHOD AND DATA MANAGEMENT SYSTEM

(75) Inventor: Kazuaki Ohshima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 419 days.

(21) Appl. No.: 11/440,125

(22) Filed: May 25, 2006

(65) Prior Publication Data

US 2006/0273166 A1    Dec. 7, 2006

(30) Foreign Application Priority Data

Jun. 1, 2005   (JP) .................................. 2005-160904

(51) Int. Cl.
*G06K 5/00* (2006.01)
(52) U.S. Cl. ..................................... 235/380; 340/572.1
(58) Field of Classification Search .................. 235/380; 340/572.1
See application file for complete search history.

(56) References Cited

U.S. PATENT DOCUMENTS

| | | | | |
|---|---|---|---|---|
| 2003/0151511 A1* | 8/2003 | Duncan et al. | ............. | 340/572.1 |
| 2003/0235066 A1* | 12/2003 | Forbes | ............. | 365/145 |
| 2004/0026690 A1* | 2/2004 | Bernds et al. | ............. | 257/40 |
| 2005/0093679 A1* | 5/2005 | Zai et al. | ............. | 340/10.2 |
| 2005/0134436 A1* | 6/2005 | Brookner | ............. | 340/14.69 |
| 2006/0109131 A1* | 5/2006 | Sen et al. | ............. | 340/572.8 |
| 2007/0153565 A1 | 7/2007 | Nomura et al. | | |
| 2008/0083954 A1 | 4/2008 | Tokunaga | | |
| 2008/0210932 A1 | 9/2008 | Yukawa et al. | | |

FOREIGN PATENT DOCUMENTS

| | | |
|---|---|---|
| JP | 07-190779 | 7/1995 |
| JP | 2002-333857 | 11/2002 |
| JP | 2004-251859 | 9/2004 |
| WO | WO 2005/098745 | 10/2005 |

\* cited by examiner

*Primary Examiner* — Daniel A Hess
*Assistant Examiner* — Rafferty Kelly
(74) *Attorney, Agent, or Firm* — Eric J. Robinson; Robinson Intellectual Property Law Office, P.C.

(57) ABSTRACT

In managing an underground facility, considering the enormous number of documents, the number of people who are involved with the management of electric power, communication, gas, water, sewage or the like, and expended hours, enormous cost and time have been needed so far. A wireless chip is attached to each buried object itself in substitution for a boundary stake or a display stake of an underground facility or a ground facility. Then, data such as embedded date, position data, or an owner is written into a memory portion of the wireless chip. In addition, by incorporating a CUP in the wireless chip, only a terminal having an encryption function which has obtained permission of communication can communicate, and access by unspecified number of devices, leakage of position data or the like, an erasure of stored data, rewriting, and the like can be prevented. Such a system can surely perform management of facility data.

20 Claims, 15 Drawing Sheets

DATA MANAGEMENT METHOD AND DATA MANAGEMENT SYSTEM

BACKGROUND OF THE INVENTION

1. Field of the Invention

The present invention relates to a method for managing facility data such as underground and a system for the method.

2. Description of the Related Art

Boundary stakes showing a land border location and display stakes showing a location of each facility such as electric power cables, communication cables, gas pipes, water pipes, sewage pipes, and another underground facility which are buried in public underground facilities such as roads and sites have been provided innumerably on Japanese land so far.

In particular, as for a public facility under the ground, there are record documents at the time of establishment construction of each facility, documentary photographs, drawings or the like; however, there are no general associated documents so much, and it is impossible to figure out where an underground facility is located without digging up a land surface near the spot in maintenance or additional construction.

Accordingly, it is necessary that people involved in the underground facility be in the presence, dig up the land surface and check the underground facility.

Further, in a case where an underground facility is managed in such a work, considering the enormous number of documents, the number of people who are involved with the management of electric power, communication, gas, water, sewage or the like, and expended hours, enormous cost and time are needed.

In storing data in paper or the like conventionally, there have been problems in deterioration of the paper which is a storage medium, problems in a filing method, and problems in difficulty of data sharing; therefore, there is a problem in that enormous data can be used for only some specific people.

For example, various kinds of data are stored in a landmark for indicating adjacent boundaries or a ground sign for labeling underground utilities, and the stored data can be easily read from the ground, so that a sign which is buried in the ground surface in a state that attribute data which is associated with a sign is buried in the ground surface can be collected and a top part thereof is exposed over the ground level is proposed (Reference 1: Japanese Patent Laid-Open No. 2004-251859).

In addition, a method to set a memory chip to which various kinds of data which is associated with each object are inputted in a plurality of objects arranged within a predetermined field is proposed (Reference 2: Japanese Patent Laid-Open No. 2002-333857). Communication with the object is carried out by aiming a wireless portable terminal at the direction of a memory chip of a desired object and reading various kinds of data from the memory chip which is set in the desired object, so that various kinds of data which is associated with the object are obtained. In addition, security is attempted with different effectiveness of reading signals in each field.

In addition, a survey stake with which a cast location can be easily found out is suggested (Reference 3: Japanese Patent Laid-Open No. Hei 7-190779). A pole receiving area is formed in a main body where a cast portion is provided in a lower end of this survey stake, and a storage means is provided to store position data of a spot where the main body is cast. The storage means has a configuration having an input/output portion provided on the pole receiving area side and a data storage portion connected to the input/output portion, and a location of the survey stake is found by using a GPS device.

By a conventional method, a boundary stake showing a land border location, or a display stake showing kinds and locations of each facility such as underground facility is provided innumerably, so that its management or an installation site becomes a problem.

In addition, it is concerned that signs which are buried in the ground surface in a state that an upper part thereof is exposed to the ground level are innumerably provided as shown in Patent Document 1. For example, in construction of a driveway or a sidewalk, or construction of a building, a public institution or the like, there are problems such as limitation of these construction forms, limitation of a construction place, a long construction period, and increase of expenses due to exposure of the sign to the ground level.

In addition, by a method shown in Patent Document 2, when a wireless terminal portion and a memory chip portion transmit/receive data, there is a problem in a memory chip operation without being described from where an operation power source of the memory chip portion is obtained. Moreover, when the memory chip portion communicates with the wireless terminal portion, a wireless portable terminal is aimed at the direction of a desired object and various kinds of data are read from the memory chip which is set in the desired object, so that various kinds of data which is associated with the object are obtained. Accordingly, in a case where the memory chip is provided in the object or in the underground, the memory chip cannot be found out visually.

In addition, a method in which a main body which is in a state of being exposed to a top part of the ground level is buried in the ground is used in Patent Document 3; however, there are problems such as limitation of a construction form, limitation of a construction place, a long construction period, and increase of expenses due to exposure of a sign to the ground level. Furthermore, since position data is obtained by the GPS, special equipment is necessary, which leads to the increase of the construction cost.

SUMMARY OF THE INVENTION

In view of the aforementioned problems, the present invention solves problems such as a power source problem or such that a sign is exposed to the ground level, and provides a managing system which can obtain data on facilities simplify, promptly and surely. In addition, the present invention provides a managing system having an improved security function.

The present invention performs data management of a managed object by attaching a wireless chip to a facility itself which is buried in the underground or the like. In a case where data management related to a certain facility is performed, the wireless chip is attached to the facility itself, so that a stake or the like that is required for management of the facility is not required to be provided on the ground and a land can be effectively used.

In addition, by a facility data management system of the present invention, by incorporating a CUP (Central Processing Unit) in a wireless chip, only a terminal having an encryption function which has obtained permission of communication can communicate, and access by unspecified number of devices, leakage of position data or the like, an erasure of stored data, rewriting or the like can be prevented.

A specific structure of the present invention is shown below.

One mode of a data management method in accordance with the present invention includes a step of writing first data into a memory that a wireless chip has, a step of attaching the wireless chip to a managed object, a step of burying the managed object to which the wireless chip is attached, a step of writing second data into the memory by using wireless communication, and a step of reading the first data or the second data written into the memory by using wireless communication.

Another mode of the present invention includes a step of attaching a wireless chip to a managed object, a step of burying the managed object to which the wireless chip is attached, a step of writing first data into a memory that the wireless chip has, a step of writing second data into the memory by using wireless communication, and a step of reading the first data or the second data written into the memory by using wireless communication.

Another mode of the present invention includes a step of writing first data in each memory that a plurality of wireless chips has, a step of attaching the plurality of wireless chips to each managed object, a step of burying the managed object to which the wireless chip is attached, a step of selecting a particular wireless chip from among the plurality of wireless chips by using wireless communication including a encrypted signal, a step of writing second data into a memory of the selected wireless chip by using wireless communication, and a step of reading the first data or the second data written into the memory of the wireless chip by using wireless communication.

In the aforementioned mode, the wireless communication is preferably performed by using a reader/writer. In addition, the second data may be obtained by being downloaded from a server through the reader/writer. In addition, a step of downloading third data which is associated with the first data or the second data from the server to the reader/writer may be included.

One mode of a data management system in accordance with the present invention includes a managed object which is buried, a wireless chip attached to the managed object, a memory which is included in the wireless chip, and stores first data which is associated with the managed object, a reader/writer which can obtain the data stored in the memory by wireless communication, and a data processor incorporating second data which is associated with the managed object. The wireless chip includes a circuit for writing the second data into the memory through the reader/writer.

Another mode of the present invention includes a managed object which is buried, a wireless chip attached to the managed object, a memory which is included in the wireless chip and stores first data which is associated with the managed object, a reader/writer which can obtain the data stored in the memory by wireless communication, and a data processor incorporating second data which is associated with the managed object. The wireless chip includes a circuit for writing the second data into the memory through the reader/writer, and the second data is data obtained by being downloaded from a server connected to the data processor.

Another mode of the present invention includes a managed object which is buried, a wireless chip attached to the managed object, a memory which is included in the wireless chip, and stores first data which is associated with the managed object, a reader/writer which can obtain the data stored in the memory by wireless communication, and a data processor incorporating second data which is associated with the managed object. The wireless chip includes a circuit for writing the second data into the memory through the reader/writer, and a CPU, and the second data is data obtained by being downloaded from a server connected to the data processor.

Another mode of the present invention includes a plurality of managed objects which is buried, a wireless chip attached to each of the plurality of managed objects, a memory which is included in the wireless chip, and stores first data which is associated with the managed object to which the wireless chip is attached, a reader/writer which can obtain the data stored in the memory by wireless communication, and a data processor incorporating second data which is associated with the managed object. The wireless chip includes a circuit for writing the second data into the memory through the reader/writer, and a CPU, an encrypted signal is generated by the CPU, the reader/writer has a function of finding out a particular wireless chip from among the plurality of the wireless chips by using the encrypted signal, and the second data is data obtained by being downloaded from a server connected to the data processor.

As for the memory which can be used in the present invention, there is a memory element with a memory material layer interposed between a pair of electrodes, where the electrodes are short-circuited to each other by an electrical action so that data can be written into the memory material layer, or a memory provided with a memory element including a structure which is impossible for data to be rewritten. However, the present invention is not limited to these. A rewritable memory element may also be used.

Note that in the present invention, to be buried or laid in the underground means that an object is put in a state that cannot be easily observed or a state that cannot be checked, and is not limited to be buried in the underground. For example, to be embedded in a wall of a building, to be submerged underwater, to be put in a dangerous area for the human beings to enter (for example, near a nuclear reactor of a nuclear power plant, or the like), or the like are included in the meaning of being buried or laid in the underground in the present invention. In addition, a server means an external data processor which is connected to a data network using a so-called telephone line or the like, and can transmit/receive required data.

By using the facility data management system of the present invention, it is not required to provide a stake on the ground so that the land can be used effectively.

A wireless chip using a CPU is used for the facility data management system of the present invention, so that only a terminal having an encryption function which has obtained permission of communication can communicate, and access by unspecified number of devices, leakage of position data or the like, an erasure of stored data, rewriting or the like can be prevented.

Moreover, the wireless chip has an encryption function, which has such a structure that data of a memory circuit is not to be transmitted to a reader/writer unless key data to break an encryption is included in data transmitted from an RF circuit to a CPU.

By using such a facility data management system of present invention, only data required from among data which is associated with many underground facilities or ground facilities can be received by a reader/writer from a data processor when necessary. As a result, an enormous amount of data on facilities can be obtained easily, promptly and surely on site, and a more convenient managing system can be realized.

DETAILED DESCRIPTION OF THE INVENTION

Figure 1:
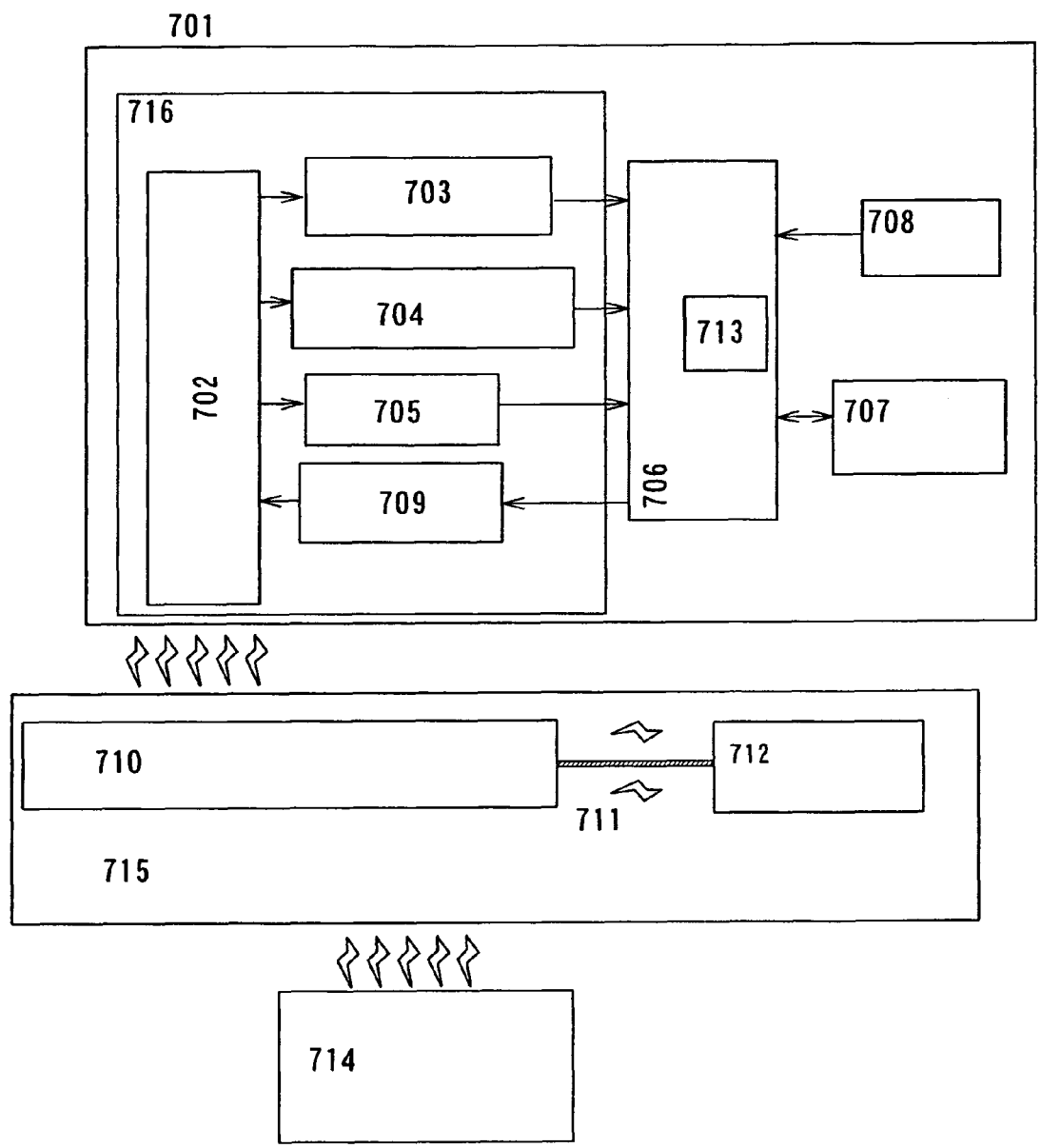
FIG. 1 shows a configuration of a wireless chip and a communication mode of the present invention.

Embodiment modes of the present invention will be described with reference to the drawings. It is to be understood that various changes and modifications will be apparent to those skilled in the art. Therefore, unless such changes and modifications depart from the scope of the present invention, they should be construed as being included therein. Note that in all the drawings for describing embodiment modes, the same reference numerals are given to the parts having similar functions or the same functions, and the description of such parts is not made repeatedly.

Embodiment Mode 1

In this embodiment mode, a facility such as an underground installation is used as an example of a managed object and a data management system structure of the facility is described.

A wireless chip 701 of the present invention has a resonant circuit 702 having an antenna and a resonant capacitor, a power supply circuit 703, a clock generator circuit 704, a demodulation circuit 705, a control circuit 706, a memory circuit 707 provided with a memory element such as a write-once memory, a modulation circuit 709, an A/D converter circuit 708, a CPU 713, and an RF circuit 716 as shown in FIG. 1.

The RF circuit 716 has the resonant circuit 702, and the resonant circuit 702 is connected to the power supply circuit 703, the clock generator circuit 704, the demodulation circuit 705, and the modulation circuit 709, and performs exchanges of signals and power. Signals from the power supply circuit 703, the clock generator circuit 704, and the demodulation circuit 705 are inputted to the control circuit 706, so that the CPU 713 provided in the control circuit 706 can be operated. In addition, the modulation circuit 709 outputs a signal received from the control circuit 706 to the resonant circuit 702 (the signal is inputted to the resonant circuit 702). The control circuit 706 and the memory circuit 707 perform two-way exchanges of signals. In addition, a signal from the A/D converter circuit 708 is inputted to the control circuit 706, and a conversion between an analog signal and a digital signal can be performed.

The wireless chip 701 is not limited to the aforementioned configuration, and may have a congestion control circuit and the like. A mask ROM (Read Only Memory) can be used as a non-volatile memory which is impossible for data to be rewritten other than a write-once memory having an insulator between electrodes as a non-volatile memory. The non-volatile memory which is impossible for data to be rewritten can prevent falsification of specific data. On the other hand, a rewritable non-volatile memory may be provided. A flash memory, an EEPROM (Electrically Erasable Programmable Read Only Memory), a ferroelectric memory, or the like is used as the rewritable non-volatile memory. Such a wireless chip 701 can be attached to a buried object at embedding time or a front-end step.

The memory circuit 707 that the wireless chip 701 has can store specific data in accordance with a buried object such as the embedded date, position data, or an owner at embedding time or a front-end step.

The RF circuit 716 has a function of transmitting/receiving an electric wave to/from a reader/writer 715, and can generate power supply for the wireless chip 701.

The CPU 713 accesses the memory circuit 707 based on data transmitted from the RF circuit 716. In addition, the CPU 713 has an encryption function, and can have such a structure that data of the memory circuit 707 is not to be transmitted to the reader/writer 715 unless key data for encrypting is included in the data transmitted from the RF circuit 716.

The reader/writer 715 can perform wireless communication by using a data-communications network such as a mobile phone or the like, and can be connected to a data processor (a server) 714.

The data processor 714 can store a large amount of data that the wireless chip 701 cannot store, which is related to a buried object such as documents of peripheral map data, a photograph at embedding time, or each constructor. Needless to say, these pieces of data may be stored in the wireless chip 701.

Data is transmitted/received to/from the data processor (the server) 714 by using the reader/writer 715, and accordingly the required data can be obtained immediately on the spot by displaying the data on a display portion of the reader/writer 715.

Although an underground installation is taken up in this embodiment mode, this facility data management system can be applied to an electric power cable, a piping, and the like of a ground facility, as well as an underground facility.

Next, description is made of a data exchange between the wireless chip 701 and the reader/writer 715. In addition, a device using a semiconductor element such as a wireless chip of the present invention can also be called a semiconductor device. In addition, a reader/writer of the present invention may be either a portable type or a fixed type.

The reader/writer 715 shown in FIG. 1 has an antenna 710 of the reader/writer and a data processor (a computer) 712. The data processor 712 can control the reader/writer 715. In addition, a power supply potential is generated in the power supply circuit 703 when the resonant circuit 702 receives an electric wave emitted from the antenna 710 of the reader/writer 715 in the wireless chip 701. In addition, data from the electric wave received in the demodulation circuit 705 is demodulated. Transmission of data to the reader/writer 715 is performed by the modulation circuit 709. In this manner, the reader/writer 715 and the wireless chip 701 can perform transmission/reception of data by wireless communication. Note that the data processor 712 may have a memory device.

The antenna 710 of the reader/writer is connected to the data processor 712 through a telecommunication line 711, and can perform transmission/reception of data to/from the wireless chip 701 based on the control of the data processor 712. Note that a data exchange may be performed by using a wireless communication line such as an infrared communication line for the telecommunication line 711 between the antenna 710 in the reader/writer and the data processor 712.

The resonant circuit 702 has a function of receiving an electric wave emitted from the antenna 710 of the reader/writer 715 and generating an alternating current signal on both ends of the antenna. The alternating current signal generated serves as electric power of the wireless chip 701, and includes data such as a command transmitted from the antenna 710 of the reader/writer 715. The alternating current signal generated in the resonant circuit 702 is rectified by a diode and smoothed by using a capacitor, so that the power supply circuit 703 generates a power supply potential to be supplied to each circuit. The clock generator circuit 704 has a function of generating clock signals with various frequencies based on the alternating current signal generated in the resonant circuit 702. The demodulation circuit 705 has a function of demodulating data included in the alternating current signal generated in the resonant circuit 702.

The control circuit 706 extracts a command from the demodulated signal, and has a function of implementing a series of operations in accordance with the command by controlling the memory circuit 707 and the A/D converter circuit 708. Further, the control circuit 706 may have a function of checking whether the demodulated signal has an error or not. In addition, the control circuit 706 has a function of transmitting a write command to the memory circuit 707, and storing data stored into a register or the like into a memory area of the memory circuit 707. Needless to say, it can be performed without a register. Similarly, the control circuit 706 transmits a read command to the memory circuit 707 and can read data. Then, a signal encoded by an encoding circuit in the control circuit 706 is generated and outputted to the modulation circuit 709.

A write-once memory can be provided in the memory circuit 707. The write-once memory is a write-once-read-memory and a non-volatile memory which is impossible for data to be rewritten. In addition, a rewritable non-volatile memory may be provided in the memory circuit 707. With such a memory circuit 707, data specific to the wireless chip 701 can be held.

The modulation circuit 709 has a function of modulating a carrier wave based on the encoded signal.

An example in which the wireless chip 701 receives power supply from the antenna 710 of the reader/writer 715 is shown in this embodiment mode; however, the present invention is not limited to this mode. For example, the wireless chip 701 having an internal battery or the like can perform power supply and can perform only data transmission/reception by wireless with the antenna 710 of the reader/writer 715.

Figure 15A:
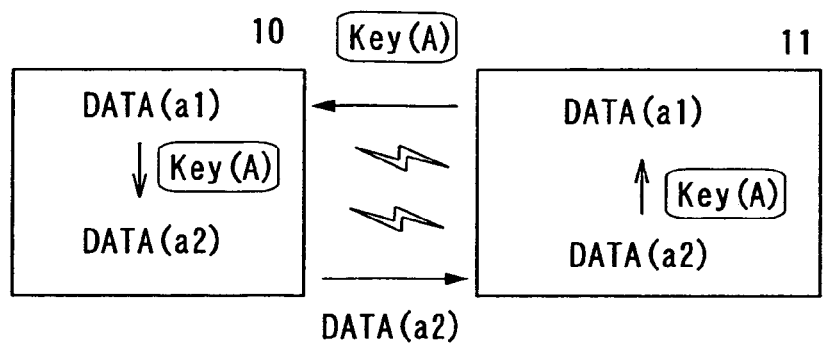
FIGS. 15A and 15B are diagrams showing key data of the present invention.

Next, an encrypted signal generated by the CPU 713 and a key data, is described. FIG. 15A shows a flow of key data to search a particular wireless chip 10 from among a plurality of wireless chips by using a reader/writer 11. First, key data (Key (A)) that the reader/writer 11 has is transmitted only to the wireless chip 10 by wireless communication. When this is performed before a wireless chip is buried, there are few errors and preferable. Needless to say, even after being buried, at a stage of grasping a location of a wireless chip, the key data (Key (A)) may be transmitted to the wireless chip 10. Then, data (DATA (a1)) that the wireless chip 10 has can be converted into encrypted data (DATA (a2)) by the key data (Key (A)). That is, an encryption process can be performed.

Then, when the key data (Key (A)) is transmitted from the reader/writer 11 at check time, the data (DATA (a2)) can be obtained from the wireless chip 10 which is responsive only to the key data (Key (A)). The reader/writer 11 which receives the data (DATA (a2)) has the key data (Key (A)) for decrypting the data (DATA (a2)) into the data (DATA (a1)) before being encrypted. Then, the data (DATA (a1)) can be displayed on a display portion. The display portion is preferably provided in the reader/writer 11.

In this manner, a particular wireless chip can be searched from among the plurality of wireless chips which is buried so as not to be seen visually in a particular area. In addition, the reader/writer 11 is required to have key data corresponding to each wireless chip for specifying each wireless chip.

Figure 15B:
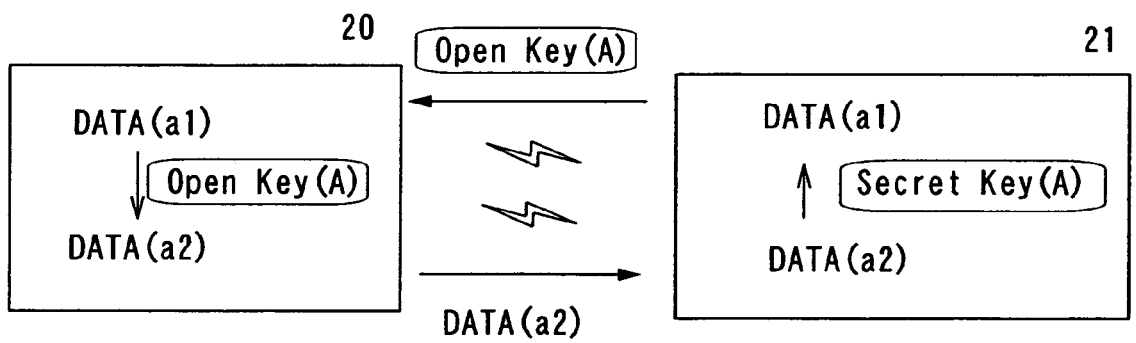

FIG. 15B is different from FIG. 15A in that public key data (Open Key (A)) is transmitted. Therefore, a reader/writer 21 has private key data (Secret Key (A)). A wireless chip 20 which receives the public key data (Open Key (A)) can convert the data (DATA (a1)) that the wireless chip 20 has into the encrypted data (DATA (a2)).

Then, when the public key data (Open Key (A)) is transmitted from the reader/writer 21 at check time, the data (DATA (a2)) can be obtained from the wireless chip 20 which is responsive only to the public key data (Open Key (A)). The reader/writer 21 which receives the data (DATA (a2)) has the private key data (Secret Key (A)) which is associated with the public key data (Open Key (A)) for decrypting the data (DATA (a2)) into the data (DATA (a1)) before being encrypted. Then, the data (DATA (a1)) can be displayed on a display portion. The display portion is preferably provided in the reader/writer 21.

In this manner, the public key data (Open Key (A)) and the private key data (Secret Key (A)) are separately provided so that falsification or theft of data can be prevented. That is, by a method shown in FIG. 15B, even when the public key data (Open Key (A)) is stolen, the private key data (Secret Key (A)) can prevent data falsification.

Next, description is made of a facility data management system in a case where such a wireless chip is attached to a certain facility.

A wireless chip of the present invention can exchange data with a reader/writer by wireless communication. Accordingly, a wireless chip can be buried in a facility or installed in an underground facility. In this manner, the wireless chip a location of which cannot be grasped visually is called a buried wireless chip. The present invention can search a particular wireless chip even from among the buried wireless chips.

An installation of such a wireless chip may be performed before completing the construction of the facility. In an installed wireless chip, initial data (called first data) on a facility and for example, a material, durability prediction data, a completion date, a supervisor or the like is stored. The initial data may be stored in a wireless chip either before installing or after installing. Since the wireless chip of the present invention has a wireless communication function, the initial data can be stored in the wireless chip after installing.

After a predetermined time has passed, a check is implemented for maintenance of a facility, management, grasping or the like. At that time, a checkout worker carries a reader/writer with him and searches a wireless chip attached to a facility. A location of the wireless chip attached can be almost grasped by using a design drawing and the like, and when an exact location of a wireless chip is not found, a data exchange can be performed by controlling a communication distance between the reader/writer and the wireless chip. At this time, the reader/writer and the wireless chip are controlled so as to perform an exchange of data only with a particular wireless chip from among a plurality of wireless chips.

In the wireless communication with a wireless chip, in a case where an encryption key is set by a CPU of the wireless chip, and the reader/writer emits a signal having particular key data, the reader/writer can secure communicate with the wireless chip. With such a mode, it is not required to grasp the location of the wireless chip by using a design drawing and the like, and management of the wireless chip can be facilitated.

Further, in a case where the reader/writer communicates with the wireless chip, data (called second data) such as documents of peripheral map data, a photograph at embedding time, or each constructor can be stored by a data processor of the reader/writer, so that a data exchange with the wireless chip and the data can be performed.

In addition, the reader/writer which receives data stored in the wireless chip can also check the data on a display portion. That is, the reader/writer may be provided with the display portion. Thus, an operation can be performed based on the data displayed on the display portion of the reader/writer, so that facilitation of the operation or reduction of documents to be carried can be attempted.

In the present invention, by attaching a wireless chip to each buried object itself in substitution for a boundary stake or a display stake, data such as embedded date, position data, or an owner can be written into a memory circuit in a wireless chip, and in maintenance, a check or additional work, presence of each person in charge or digging up the land surface excessively as is conventionally done is not required, which leads to shorter time or lower cost.

In addition, since a stake is not required to be provided by the present invention, a ground can be flattened, and a land can be effectively used.

Moreover, a CPU is mounted on a wireless chip, so that only a terminal having an encryption function which has obtained permission of communication can communicate, and access by unspecified number of devices, leakage of position data or the like, an erasure of stored data, rewriting or the like can be prevented.

Furthermore, a reader/writer has a function of being connected to a data processor by using a data-communications network such as a mobile phone and the like, so that a large amount of data, which cannot be displayed on a stake and cannot be stored in a wireless chip, such as a construction photograph or each work document can be displayed on a display portion of the reader/writer.

The present invention provides a facility data management system which can obtain an enormous amount of data on buried objects easily, promptly and surely on site. Moreover, maintenance, a check, or additional work can be performed without the presence of each worker, which leads to shorter time or lower labor cost.

For such a facility data management system of the present invention, it is concerned that signs which are buried in the ground surface in the state that the upper part thereof is exposed to the ground level are innumerably provided as shown in Patent Document 1. For example, in the construction of a driveway or a sidewalk or the construction of a building, a public institution or the like, there are problems such as the limitation of these construction forms, the limitation of a construction place, a long construction period, and the increase of expenses due to the exposure of the sign to the ground level. However, in the present invention, a ground level can be flattened and an effective use of the ground level is possible by attaching a wireless chip to a facility itself. For example, the limitation of these construction modes such as the driveway, the sidewalk, the building, or the public institution, the limitation of the construction place, or the like can be reduced significantly compared with Patent Document 1.

In addition, by the method shown in Patent Document 2, when the wireless terminal portion and the memory chip portion transmit/receive data, there is the problem in the memory chip operation without being described from where the operation power source of the memory chip portion is obtained. Moreover, when the memory chip portion communicates with the wireless terminal portion, the wireless portable terminal is set for the desired object and various kinds of data are read from the memory chip which is set in the desired object, so that various kinds of data which is associated with the object are obtained. Accordingly, in the case where the memory chip is provided in the object or in the underground, the memory chip cannot be found out. However, in the present invention, operating power of a wireless chip is obtained by using the electric wave containing data transmitted from a reader/writer in an RF circuit portion. Moreover, since a reader/writer has an encryption key for each wireless chip in the present invention, a location of each wireless chip can be checked by obtaining position data stored in the wireless chip even when an object is installed in the underground, or the like which cannot be distinguished in Patent Document 2.

Similarly to Patent Document 1, the method in which the main body which is in the state of being exposed to the top part of the ground level is buried in the ground surface is used in Patent Document 3; however, there are problems such as the limitation of a construction form, the limitation of a construction place, a long construction period, and the increase of expenses due to the exposure of the sign to the ground level. Furthermore, since the position data is obtained by the GPS, the special equipment is necessary, which leads to the increase of the construction cost. However, in the present invention, a ground level can be flattened and an effective use of the ground level is possible by attaching a wireless chip to a facility itself. For example, the limitation of construction modes such as the driveway, the sidewalk, the building, or the public institution, the limitation of the construction place, or the like can be reduced significantly compared with Patent Document 3. In addition, in the present invention, construction data required is obtained from a data processor by using a data-communications network such as a mobile phone in which facility environment is in place or the like, so that large cost reduction is possible compared with Patent Document 3.

Embodiment Mode 2

In this embodiment mode, description is made of the memory circuit 707 that the wireless chip 701 has, and an operation method thereof.

Figure 2:
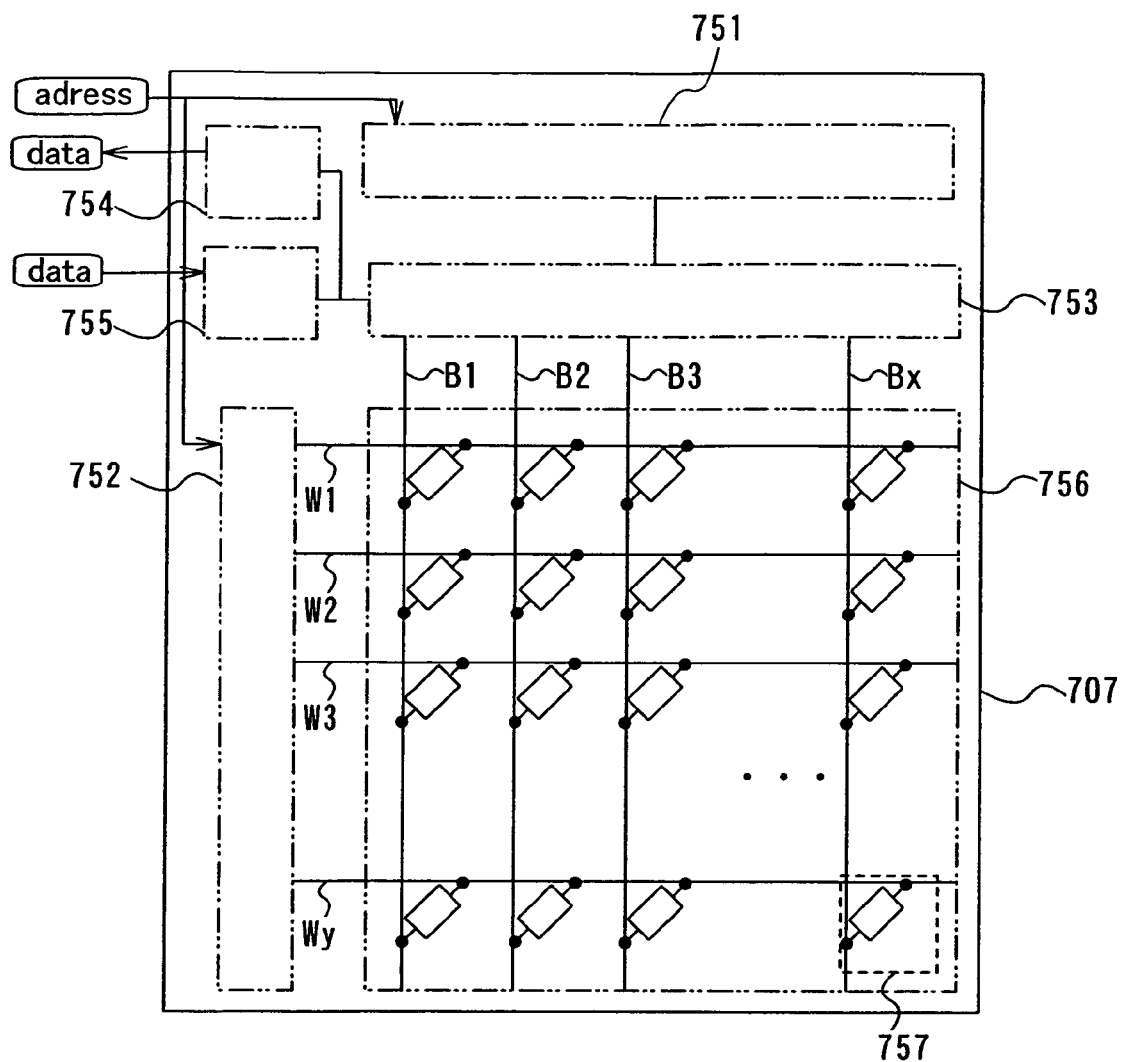
FIG. 2 shows a configuration of a memory circuit that a wireless chip of the present invention has.

As shown in FIG. 2, the memory circuit 707 includes a memory cell array 756 in which memory elements are formed and a driver circuit. The driver circuit includes a column decoder 751, a row decoder 752, a reading circuit 754, a writing circuit 755, and a selector 753.

The memory cell array 756 includes a bit line Bm (m=1 to x), a word line Wn (n=1 to y), and a memory cell 757 each at an intersection between the bit line and the word line. Note that the memory cell 757 may be either an active type in which a transistor is connected or a passive type which is constituted only by a passive element. In addition, the bit line Bm is controlled by the selector 753 and the word line Wn is controlled by the row decoder 752.

The column decoder 751 receives an address signal for specifying an arbitrary bit line and supplies a signal to the selector 753. The selector 753 receives the signal of the column decoder 751 to select the specified bit line. The row decoder 752 receives an address signal for specifying an arbitrary word line to select the specified word line. According to the above operation, one memory cell 757 corresponding to the address signal is selected. The reading circuit 754 reads data included in the selected memory cell and outputs it. The writing circuit 755 generates a voltage required for writing to apply to the selected memory cell, thereby data writing is performed.

Next, a circuit configuration of the memory cell 757 is described. In this embodiment mode, description is made of a memory cell including a memory element 783 in which a lower electrode and an upper electrode are provided and a memory material layer is interposed between the pair of electrodes.

Figure 3A:
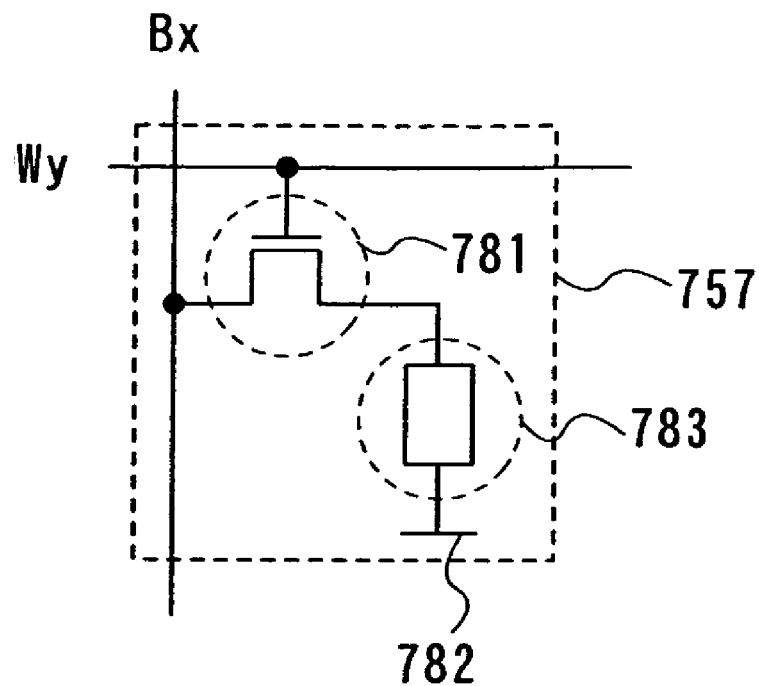
FIGS. 3A and 3B show a memory element that a memory circuit of the present invention has.

The memory cell 757 shown in FIG. 3A is an active memory cell including a transistor 781 and the memory element 783. To the transistor 781, a thin film transistor can be applied. A gate electrode of the transistor 781 is connected to a word line Wy. In addition, one of a source electrode and a drain electrode of the transistor 781 is connected to a bit line Bx while the other thereof is connected to the memory element 783. The lower electrode of the memory element 783 is electrically connected to the one of the source electrode and the drain electrode of the transistor 781. In addition, the upper electrode (corresponds to a reference numeral 782) of the memory element 783 can be shared between the memory elements, as a common electrode.

Figure 3B:
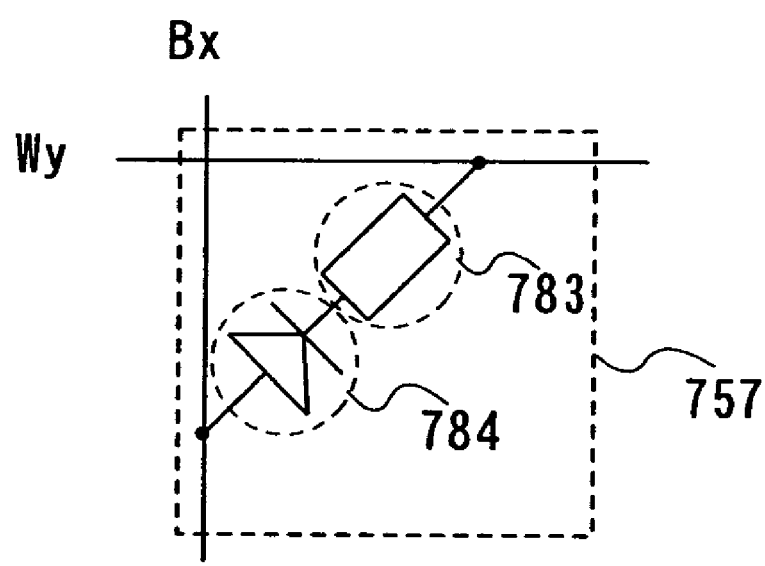

In addition, a configuration as shown in FIG. 3B in which the memory element 783 is connected to a diode 784 may be used as well. The diode 784 can adopt a so-called diode connection structure in which one of a source electrode and a drain electrode of a transistor is connected to a gate electrode thereof. Further, as the diode 784, a Schottky diode which uses contact between a memory material layer and a lower electrode may also be used, a diode formed of a stacked layer of a memory material, or the like may also be used.

For the memory material layer, a material of which a property or a state changes by electrical action, optical action, thermal action or the like can be used. For example, a material of which a property or a state changes by dissolution, dielectric breakdown or the like due to Joule heat so that the lower electrode and the upper electrode can be short-circuited, may be used. Thus, the thickness of the memory material layer may be 5 to 100 nm, and preferably 10 to 60 nm. For such a memory material layer, an inorganic material or an organic material can be used and it can be formed by an evaporation method, a spin-coating method, a droplet discharging method or the like.

As the inorganic material, there are silicon oxide, silicon nitride, silicon oxynitride or the like. Even in the case of such an inorganic material, a dielectric breakdown is caused by controlling a film thickness thereof, so that the lower electrode and the upper electrode can be short-circuited.

As the organic material, for example, an aromatic amine based (in other words, including a benzene ring-nitrogen bond) compound such as 4,4'-bis[N-(1-naphthyl)-N-phenylamino]biphenyl (abbreviated: α-NPD), 4,4'-bis[N-(3-methylphenyl)-N-phenyl-amino]-biphenyl (abbreviated: TPD), 4,4'4"-tris(N,N-diphenylamino)triphenylamine (abbreviated: TDATA), 4,4'4"-tris[N-(3-methylphenyl)-N-phenylamino]triphenylamine (abbreviated: MTDATA), and 4,4'-bis[N-{4-(N,N-di-m-tolylamino)phenyl}-N-phenylamino]biphenyl (abbreviated: DNTPD); polyvinylcarbazole (abbreviated: PVK); phthalocyanine (abbreviated: $H_2Pc$); a phthalocyanine compound such as copper phthalocyanine (abbreviated: CuPc) or vanadyl phthalocyanine (abbreviated: VOPc), or the like can be used. These materials have high hole transporting properties.

In addition, as the organic material, for example, a material formed from a metal complex or the like having a quinoline skeleton or a benzoquinoline skeleton, such as tris(8-quinolinolato)aluminum (abbreviated: $Alq_3$), tris(4-methyl-8-quinolinolato)aluminum (abbreviated: $Almq_3$), bis(10-hydroxybenzo[h]quinolinato)beryllium (abbreviated: $BeBq_2$), or bis(2-methyl-8-quinolinolato)(4-phenylphenolato)aluminum (abbreviated: BAlq); or a metal complex having a oxazole-based ligand or a thiazole-based ligand, such as bis[2-(2'-hydroxyphenyl)benzoxazolato]zinc (abbreviated: $Zn(BOX)_2$) or bis[2-(2'-hydroxyphenyl)benzothiazolato]zinc (abbreviated: $Zn(BTZ)_2$), or the like can also be used. These materials have high electron transporting properties.

Furthermore, other than the metal complex, a compound such as 2-(4-biphenylyl)-5-(4-tert-butylphenyl)-1,3,4-oxadiazole (abbreviated: PBD); 1,3-bis[5-(4-tert-buthylphenyl)-1,3,4-oxadiazol-2-yl]benzene (abbreviated: OXD-7); 3-(4-tert-butylphenyl)-4-phenyl-5-(4-biphenylyl)-1,2,4-triazole (abbreviated: TAZ); 3-(4-tert-butylphenyl)-4-(4-ethylphenyl)-5-(4-biphenylyl)-1,2,4-triazole (abbreviated: p-EtTAZ); bathophenanthroline (abbreviated: BPhen); or bathocuproin (abbreviated: BCP), or the like can be used.

In addition, the memory material layer may be formed by a single layer structure or a stacked layer structure. In the case of the stacked layer structure, with the material selected above, the stacked layer structure can be formed. In addition, the above organic material and a light-emitting material may also be stacked. As the light-emitting material, there are 4-(dicyanomethylene)-2-methyl-6-[2-(1,1,7,7-tetramethyljulolidin-9-yl)ethenyl]-4H-pyran (abbreviated: DCJT); 4-dicianomethylene-2-t-butyl-6-(1,1,7,7-tetramethyljulolidin-9-enyl)-4H-pyran; periflanthene; 2,5-dicyano-1,4-bis(10-methoxy-1,1,7,7-tetramethyljulolidine-9-enyl)benzene; N,N'-dimethylquinacridone (abbreviated: DMQd); coumarin 6; coumarin 545T; tris(8-quinolinolato)aluminum (abbreviated: $Alq_3$); 9,9'-bianthryl; 9,10-diphenylanthracene (abbreviated: DPA); 9,10-di(2-naphthyl)anthracene (abbreviated: DNA); 2,5,8,11-tetra(tert-butyl)perylene (abbreviated: TBP), or the like.

Further, a layer in which the above light-emitting material is dispersed may also be used. In the layer in which the light-emitting material is dispersed, as a mother material, an anthracene derivative such as 9,10-di(2-naphthyl)-2-tert-butylanthracene (abbreviated: t-BuDNA); a carbazole derivative such as 4,4'-di(N-carbazolyl)biphenyl (abbreviated: CBP); a metal complex such as bis[2-(2'-hydroxyphenyl) pyridinato]zinc (abbreviated: $Znpp_2$) or bis[2-(2'-hydroxyphenyl)benzoxazolato]zinc (abbreviated: ZnBOX); or the like can be used. In addition, tris(8-quinolinolato)aluminum (abbreviated: $Alq_3$); 9,10-di(2-naphthyl)anthracene (abbreviated: DNA); bis(2-methyl-8-quinolinolato)(4-phenylphenolato)aluminum (abbreviated: BAlq); or the like can be used.

The glass-transition temperature (Tg) of such an organic material may be 50 to 300° C., and preferably 80 to 120° C. in order to change its property by thermal action or the like.

In addition, a material in which a metal oxide is mixed with the organic material or light-emitting material may also be used. Note that the material mixed with a metal oxide includes a state in which the above organic material or light-emitting material and the metal oxide are mixed or a state in which they are stacked. Specifically, it indicates a state which is formed by a co-evaporation method using multiple evaporation sources. Such a material can be called an organic-inorganic composite material.

For example, in a case of mixing a material having a high hole transporting property with a metal oxide, a vanadium oxide, a molybdenum oxide, a niobium oxide, a rhenium oxide, a tungsten oxide, a ruthenium oxide, a titanium oxide, a chromium oxide, a zirconium oxide, a hafnium oxide, or a tantalum oxide is preferably used as the metal oxide.

In a case of mixing a material having a high electron transporting property with a metal oxide, a lithium oxide, a calcium oxide, a sodium oxide, a potassium oxide or a magnesium oxide is preferably used as the metal oxide.

For the memory material layer, since a material of which a property changes by electrical action, optical action, or thermal action may be used; a conjugated polymer in which a compound (photoacid generator) generating acid by absorbing light is added, can also be used, for example. As the conjugated polymer, one kind of polyacetylene, one kind of polyphenylene vinylene, one kind of polythiophene, one kind of polyaniline, one kind of poly phenylene ethynylene, or the like can be used. In addition, as the photoacid generator, aryl sulfonium salt, aryl iodonium salt, o-nitrobenzyl tosylate, arylsulfonic acid p-nitrobenzyl ester, one kind of sulfonyl acetophenone, Fe-allene complex PF6 salt, or the like can be used.

Next, an operation when data writing is performed to the active memory cell 757 as shown in FIG. 3A is described. Note that in this embodiment mode, a value stored in the memory element with an initial state is '0' and a value stored in the memory element with the property changed by electrical action or the like is '1'. In addition, the resistance is high in the memory element with the initial state and the resistance is low in the memory element after change.

When writing is performed, the bit line Bm of the m-th column and the word line Wn of the n-th row are selected by the column decoder 751, the row decoder 752, and the selector 753, and the transistor 781 included in the memory cell 757 in the m-th column and the n-th row is turned on.

Subsequently, from the writing circuit 755, a predetermined voltage is applied to the bit line Bm of the m-th column for a predetermined period. For this voltage and period to be applied, such condition that the memory element 783 changes from the initial state to the state in which the resistance is low, is employed. The voltage applied to the bit line Bm of the m-th column is transmitted to the lower electrode of the memory element 783 so that a potential difference occurs between the lower electrode and the upper electrode. Therefore, current flows through the memory element 783 and there occurs a change in the state of the memory material layer so that a memory element property is changed. Then, the value stored in the memory element 783 is changed from '0' to '1'.

The writing operation described above is performed in accordance with the control circuit 706.

Figure 4:
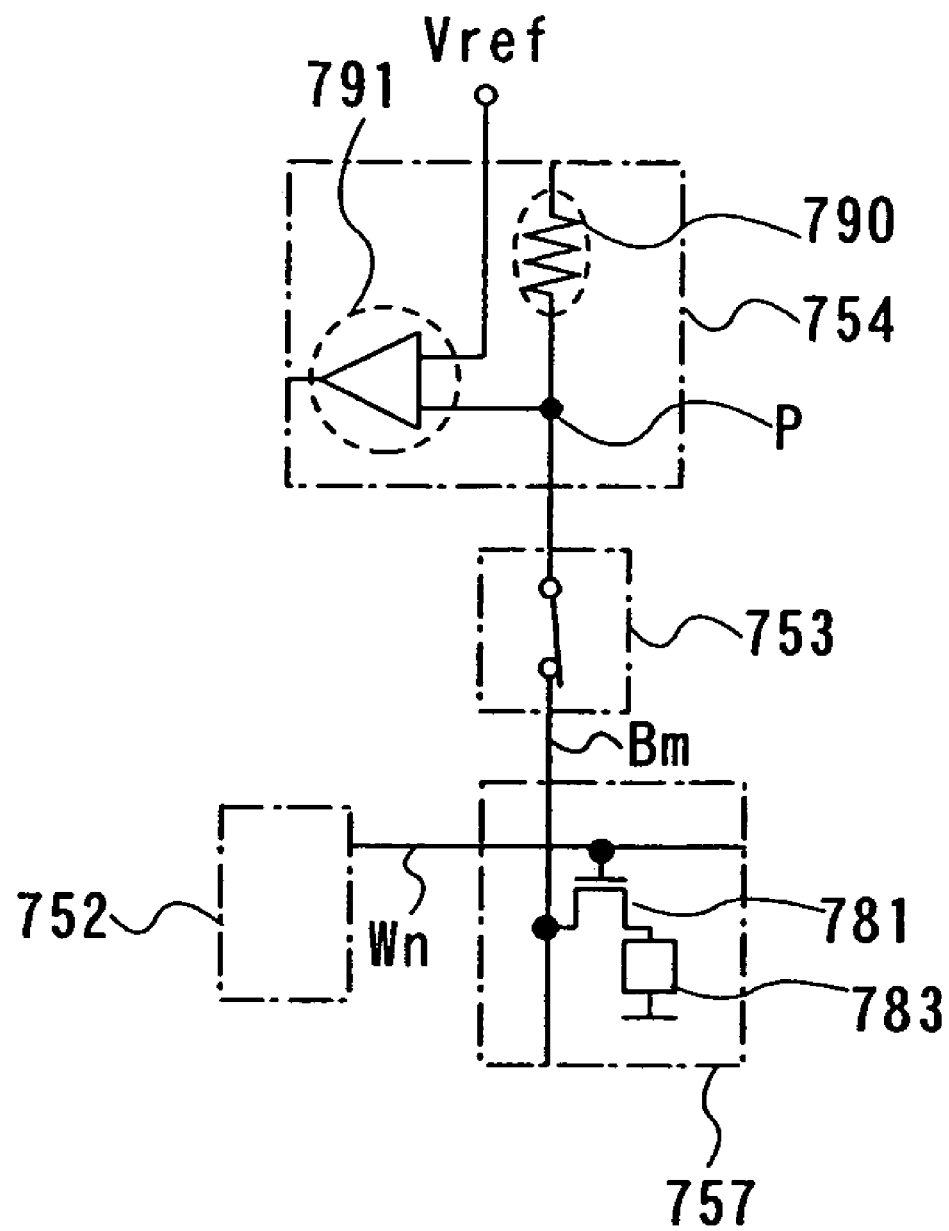
FIG. 4 shows an operation of a memory circuit of the present invention.

Next, description is made of an operation of data reading. As shown in FIG. 4, the reading circuit 754 includes a resistor 790 and a sense amplifier 791. For performing the data reading, a voltage is applied between the lower electrode and the upper electrode and whether the memory element is the initial state or the state in which the resistance is low after change is judged. Specifically, data reading can be performed by a resistance-dividing method.

For example, description is made of a case of performing data reading of the memory element 783 in the m-th column and the n-th row among a plurality of the memory elements 783 included in the memory cell array 756. First, the bit line Bm of the m-th column and the word line Wn of the n-th row are selected by the column decoder 751, the row decoder 752, and the selector 753. Therefore, the transistor 781 included in the memory cell 757 arranged in the m-th column and the n-th row is turned on so that the memory element 783 and the resistor 790 are connected in series. As a result of this, a potential at a point P shown in FIG. 4 is determined depending on the current characteristic of the memory element 783.

Where the potential of the point P in a case where the memory element is in the initial state is V1 and the potential of the point P in a case where the memory element is in the low-resistance state after change is V2, data stored in the memory element can be read out by using a reference potential Vref which satisfies V1>Vref>V2. Specifically, in the case where the memory element is in the initial state, an output potential of the sense amplifier 791 becomes Lo and in the case where the memory element is in the low-resistance state, the output potential of the sense amplifier 791 becomes Hi.

According to the above-described method, data is read out by a voltage value by using the difference of the resistance and resistance division of the memory element 783; however, the data of the memory element 783 may also be read out by a current value. Note that the reading circuit 754 of the present invention is not limited to the above configuration, and may have any configuration as long as data stored in a memory element can be read out.

The memory element having such a configuration changes its state from '0' to '1'. The change from the '0' state to the '1' state is irreversible.

Identification number of a wireless chip can be written into such a memory element 783. Then, the written data can be read out by a sensor provided in a reader/writer, that is, by wireless communication with an antenna.

Note that this embodiment mode can be implemented by freely combining with Embodiment Mode 1.

Embodiment Mode 3

In this embodiment mode, a cross sectional diagram of the memory circuit 707 is described.

Figure 5A:
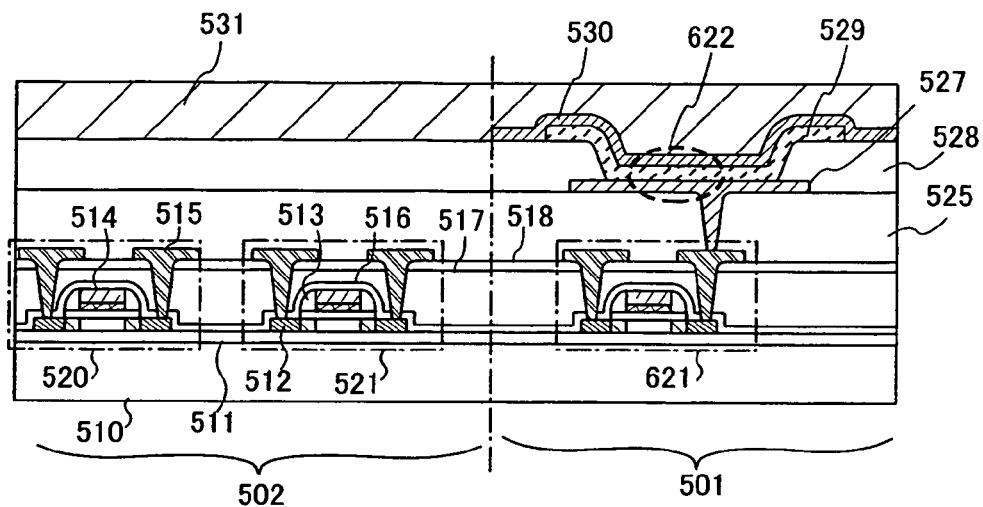
FIGS. 5A and 5B show cross sections of a memory circuit of the present invention.

FIG. 5A is a cross sectional diagram of a memory element in which a memory cell portion 501 and a driver circuit portion 502 are integrally formed over an insulating substrate 510. As the insulating substrate 510, a glass substrate, a quartz substrate, a substrate formed of silicon, a metal substrate, a plastic substrate or the like can be used. When the plastic substrate is used, a thin, lightweight wireless chip can be provided. Further, polishing is performed for the glass substrate or the like, so that a further thinner and lighter-weight wireless chip can be realized.

A base film 511 is formed over the insulating substrate 510. In the driver circuit portion 502, thin film transistors 520 and 521 are provided over the substrate 510 with the base film 511 interposed therebetween, and in the memory cell portion 501, a thin film transistor 621 is provided over the substrate 510 with the base film 511 interposed therebetween. Each thin film transistor is provided with a semiconductor layer 512 which is patterned into an island-shape, a gate electrode 514 provided over the semiconductor layer 512 with a gate insulating layer interposed therebetween, an insulator (namely, a side-wall) 513 provided on side surfaces of the gate electrode, or the like. The semiconductor layer 512 is formed with a thickness of 0.2 μm or less, typically a thickness of 40 to 170 nm, and preferably a thickness of 50 to 150 nm. Further, an insulating layer 516 covering the insulator 513 and the semiconductor layer 512 and an electrode 515 which is connected to an impurity region formed in the semiconductor layer 512 are included. Note that the electrode 515 which is connected to the impurity region can be formed by that a contact hole is formed in the gate insulating layer and the insulating layer 516, a conductive layer is formed in the contact hole, and the conductive layer is patterned.

Amorphous silicon, polycrystalline silicon or the like can be used for the semiconductor layer. In a case of using polycrystalline silicon, amorphous silicon is formed first, and heat treatment or laser irradiation is performed thereto to form polycrystalline silicon. At this time, by performing heat treatment or laser irradiation using a metal element typified by nickel, the crystallization temperature can be reduced. For the laser irradiation, a laser irradiation apparatus with a continuous wave laser or a pulsed laser can be used. In addition, a crystallization method with heat treatment and a crystallization method using a continuous wave laser or a pulsed laser beam oscillating at a repetition rate of 10 MHz or more may be combined. A surface of the crystallized semiconductor layer is irradiated by the continuous wave laser or the pulsed laser beam oscillating at a repetition rate of 10 MHz or more to be planarized; thereby realizing a thinner gate insulating layer and contributing to increasing pressure resistance of the gate insulating layer.

In addition, the semiconductor layer which is obtained by crystallization by scanning in one direction along with irradiation with the continuous wave laser or the pulsed laser beam oscillating at a repetition rate of 10 MHz or more, has a property that a crystal grows in a scan direction of the beam. By arranging a transistor such that a channel length direction (a direction in which a carrier flows when a channel forming region is formed) is aligned with the scan direction, and combining it with a gate insulating layer shown below, a thin film transistor (a TFT) with few characteristic variation and high field effect mobility can be obtained.

In a thin film transistor forming the wireless chip of the present invention, the insulating layer typified by the gate insulating layer or the like can be manufactured by oxidizing or nitriding a surface by using high-density plasma treatment. The high-density plasma treatment is such plasma treatment that the plasma density is $1\times10^{11}$ cm$^{-3}$ or more, and preferably $1\times10^{11}$ cm$^{-3}$ or more but $9\times10^{15}$ cm$^{-3}$ or less, and a high frequency wave such as a microwave (for example, a frequency of 2.45 GHz) is used. In a case where plasma is generated with such a condition, an electron temperature becomes 0.2 to 2 eV. The high-density plasma having a feature of the low electron temperature has a low kinetic energy of an activated species; therefore, a film can be formed without having plasma damage and a defect so much. In a case where an object to be formed, or a gate insulating layer, is formed, a substrate over which a patterned semiconductor layer is formed is disposed in a film formation chamber capable of such plasma treatment. Then, the distance between an electrode for generating plasma, namely an antenna and the object to be formed is set to be 20 mm or longer but 80 mm or shorter, and preferably 20 mm or longer but 60 mm or shorter to perform the film formation treatment. Such high-density plasma treatment enables low temperature process (a substrate temperature of 400° C. or less) to be achieved. Therefore, plastic of which heat resistance is low can be formed over the substrate.

As a film-formation atmosphere of such an insulating layer, a nitrogen atmosphere or an oxygen atmosphere can be used. The nitrogen atmosphere is typically a mixed atmosphere of nitrogen and a rare gas or a mixed atmosphere of nitrogen, hydrogen and a rare gas. As a gas including nitrogen and hydrogen, ammonia can be used. As the rare gas, at least one of helium, neon, argon, krypton, and xenon can be used. The oxygen atmosphere is typically a mixed atmosphere of oxygen and a rare gas, a mixed atmosphere of oxygen, hydrogen, and a rare gas, or a mixed atmosphere of dinitrogen monoxide and a rare gas. In addition, a mixed atmosphere of hydrogen and a rare gas may also be used.

By oxygen radicals (there is also a case including OH radicals) or nitrogen radicals (there is also a case including NH radicals) generated by this high-density plasma, a surface can be oxidized or nitrided.

By treatment using such high-density plasma, an insulating layer can be formed with a thickness of 1 to 20 nm, typically 5 to 10 nm. Since reaction in this case is solid phase reaction, an interface state density between the insulating layer and the semiconductor layer can be extremely lowered. Since such high-density plasma treatment directly oxidizes or nitrides the surface, for example, crystalline silicon or polycrystalline silicon in the semiconductor layer, the insulating layer to be formed can be formed to have a thickness with extremely smaller variations. In addition, in a case of crystalline silicon, it is not oxidized too much even in a crystal grain boundary; therefore, a preferable state is obtained. That is, since a surface of a semiconductor layer is solid-phase oxidized by the high-density plasma treatment as shown here, an insulating layer with good uniformity and low interface state density can be formed without abnormal oxidation reaction in the crystal grain boundary.

The insulating layer thus formed does not so damage another coating film and can be dense. In addition, the insulating layer formed by the high-density plasma treatment can improve the state of an interface which is in contact with the insulating layer. For example, when the gate insulating layer is formed using the high-density plasma treatment, the state of the interface with the semiconductor layer can be improved. Consequently, the electrical property of a thin film transistor can be improved.

The description is made of the case where the high-density plasma treatment is used for manufacturing the insulating layer; however, the high-density plasma treatment may be performed to the semiconductor layer as well. By the high-density plasma treatment, property modification of a surface of the semiconductor layer can be performed. Consequently, the state of the interface can be improved, and correspondingly, the electrical property of a thin film transistor can be improved.

For an insulating layer of the gate insulating layer or the like in the present invention, only an insulating layer formed by the high-density plasma treatment may be used or an insulating layer such as silicon oxide, silicon oxynitride, or silicon nitride may be deposited and stacked by a CVD method using plasma or thermal reaction. In any event, the transistor in which the insulating layer formed by high-density plasma is included in a part of or the entire gate insulating layer can lower characteristic variations.

Furthermore, in order to improve the flatness, insulating layers 517 and 518 may be provided. In that case, the insulating layer 517 may be formed of an organic material and the insulating layer 518 may be formed of an inorganic material. In the case where the insulating layers 517 and 518 are provided, the electrode 515 can be formed in these insulating layers 517 and 518 so as to be connected to the impurity region through a contact hole.

Further, an insulating layer 525 is provided and a lower electrode 527 is formed so as to be connected to the electrode 515. An insulating layer 528 is formed provided with an opening so as to cover an end portion of the lower electrode 527 and expose the lower electrode 527. Inside the opening, a memory material layer 529 is formed and an upper electrode 530 is formed. In this manner, a memory element 622 including the lower electrode 527, the memory material layer 529, and the upper electrode 530 can be formed. The memory material layer 529 can be formed of an organic material or an inorganic material. The lower electrode 527 or the upper electrode 530 can be formed of a conductive material. For example, a film made from an element of aluminum (Al), titanium (Ti), molybdenum (Mo), tungsten (W), silicon (Si) or the like, an alloy film using the element, or the like can be used. Furthermore, a light-transmitting material such as indium tin oxide (ITO), indium tin oxide containing silicon oxide, or indium oxide containing zinc oxide of 2 wt % or more but 20 wt % or less can also be used.

In order to improve flatness further and prevent an impurity element from entering, an insulating layer 531 may be formed.

For the insulating layer described in this embodiment mode, an inorganic material or an organic material can be used. As the inorganic material, silicon oxide or silicon nitride can be used. As the organic material, polyimide, acryl, polyamide, polyimidamide, resist or benzocyclobutene, siloxane, polysilazane or the like can be used. Note that a siloxane resin corresponds to a resin containing an Si—O—Si bond. Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is formed by using a polymer material having the bond of silicon (Si) and nitrogen (N) as a starting material.

Figure 5B:
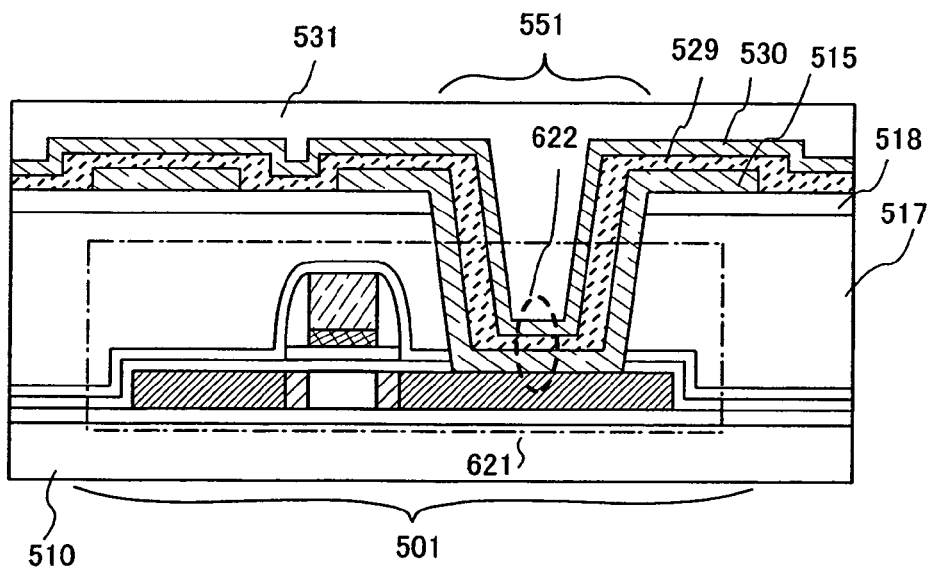

FIG. 5B is a cross sectional diagram of a memory element which is different from FIG. 5A, in which the memory material layer is formed within a contact hole 551 of the electrode 515. Similarly to FIG. 5A, the electrode 515 is used as the lower electrode, and the memory material layer 529 and the upper electrode 530 are formed over the electrode 515 to form the memory element 622. After that, the insulating layer 531 is formed. The other configuration is the same as FIG. 5A, thus description thereof is omitted herein.

By forming the memory element in the contact hole 551, miniaturization of a memory device can be achieved. Further, since an electrode for a memory is not required, the number of manufacturing steps is reduced and a memory device at low cost can be provided.

As set forth above, a memory device capable of being applied to the management system of the present invention is manufactured over an insulating substrate, and a driver circuit can be integrally formed; thereby manufacturing cost can be reduced.

Note that this embodiment mode can be implemented by freely combining with Embodiment Mode 1 and Embodiment Mode 2.

Embodiment Mode 4

In this embodiment mode, description is made of a layout of a thin film transistor of a part of a circuit included in a wireless chip.

A semiconductor layer, corresponding to the semiconductor layer 512 described in the above-mentioned embodiment mode, is formed over the entire surface or a part (a region having a larger area than an area which is determined to be a semiconductor region of a transistor) of a substrate having an insulating surface with a base film or the like interposed therebetween. Then, a mask pattern is formed over the semiconductor layer by photolithography. Then, the semiconductor layer is etched utilizing the mask pattern to form an island-like semiconductor pattern having a particular shape including source and drain regions and a channel forming region of a thin film transistor. The shape of the semiconductor layer obtained by patterning is determined in view of the circuit characteristics required or adequacy of a layout based on the characteristics of a thin film transistor.

Figure 6:
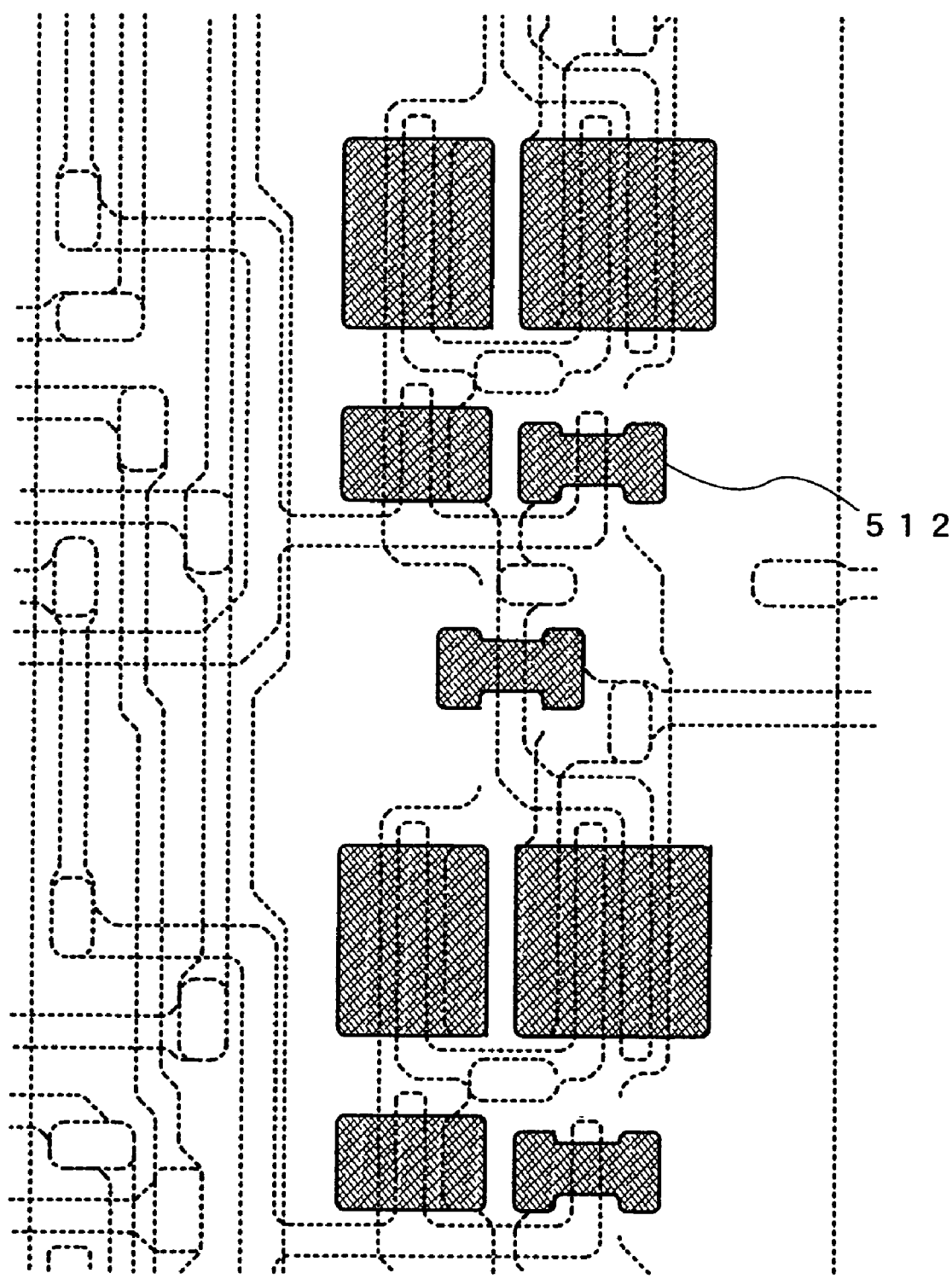
FIG. 6 shows a layout of a circuit that a wireless chip of the present invention has.

In a thin film transistor of the present invention, a photomask for forming a semiconductor layer is provided with a predetermined pattern. A pattern of this photomask is rounded without a corner (a portion of a right angle). Specifically, it is a shape that a corner (right triangle) in a pattern having a normal corner is removed. The removed corner (right triangle) has two sides forming a right angle and each side is 10 μm or shorter. The shape of this mask pattern can be transferred as a pattern shape of the semiconductor layer 512 as shown in FIG. 6. When transferring the mask pattern to a semiconductor layer, the corner of the semiconductor layer may be rounded more than a corner of the photomask pattern. That is, a corner of the pattern of the semiconductor layer may be rounded with a pattern shape which is smoother than the pattern of the photomask. Note that in FIG. 6, a gate electrode and a wire to be formed later are illustrated by dotted lines. In addition, in this embodiment mode, a corner (right triangle) having a right angle is used as an example of a corner to be removed; however, the present invention is not limited to this. Any kind of corner may be removed as long as the corner has a pointed shape. It may be an acute angle or an obtuse angle. In these cases, a condition of two sides forming a corner which is desired to be removed may satisfy the above-mentioned condition. The same can be said for the following description.

Next, a gate insulating layer is formed over the semiconductor layer which is patterned so that a rounded corner is provided. Then, as is described in the aforementioned embodiment mode, the gate electrode 514 is formed so as to partly overlap with the semiconductor layer, at the same time, a gate wire is formed. The gate electrode or the gate wire can be formed by depositing a metal layer or a semiconductor layer, and then performing photolithography.

Figure 7:
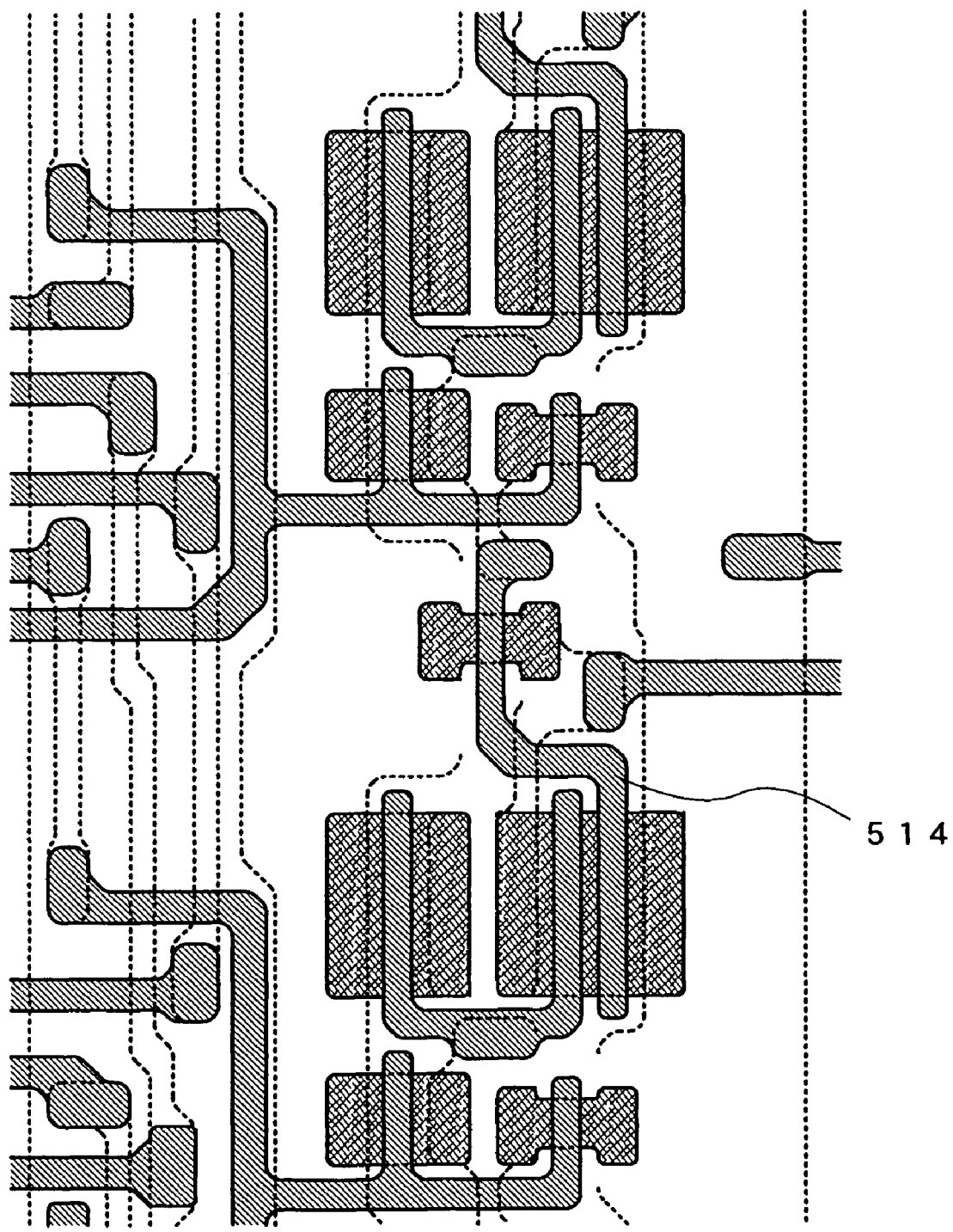
FIG. 7 shows a layout of a circuit that a wireless chip of the present invention has.

A photomask for forming this gate electrode or gate wire is provided with a predetermined pattern. A pattern of this photomask is rounded without a corner (a portion of a right angle). Specifically, it is a shape that a corner (right triangle) in a pattern having a corner is removed. The removed corner (right triangle) has two sides forming a right angle and each side is 10 μm or shorter, or a half or less and a fifth or more of a line width of the wire. In a case where a shape of the corner which is desired to be removed is not a right angle (right triangle), the condition of the two sides forming a corner which is desired to be removed may satisfy the above-mentioned condition. A shape of this mask pattern can be transferred as a pattern shape of a gate electrode or a gate wire as shown in FIG. 7. When transferring the mask pattern to the gate electrode or the gate wire, the corner of the gate electrode or the gate wire may be transferred so as to be rounded more. That is, the corner of the gate electrode or the gate wire may be rounded with a pattern shape which is smoother than the pattern of the photomask. The corner of the gate electrode or the gate wire formed by using such a photomask can be rounded. Note that in FIG. 7, wires to be formed later are illustrated by dotted lines.

Such a gate electrode or a gate wire bends in a rectangle due to limitation of the layout. Therefore, a projecting portion (an exterior side) and a depressed portion (an interior side) are provided at a round corner of the gate electrode or the gate wire. In the case of dry etching using plasma, the generation of fine particles by abnormal electrical discharge can be suppressed by forming this rounded projecting portion. In addition, in a case of an unrounded corner, when fine particles are generated and gathered in the corner, it is difficult to wash them away, and yield is decreased. However, if a rounded depressed portion is formed, even when fine particles are generated, they can be washed away easily. Accordingly, there is an effect that yield is expected to be drastically improved.

Next, over the gate electrode or the gate wire, insulating layers corresponding to the insulating layers 516, 517, and 518, or the like are formed as is indicated in the aforementioned embodiment mode. Needless to say, the insulating layer may be a single layer in the present invention.

Then, an opening is formed at a predetermined position of the insulating layer, and a wire corresponding to the electrode 515 is formed in the opening. This opening is provided in order to electrically connect the semiconductor layer or the gate wire layer located in the lower layer, to the wire layer. The wire is formed in a predetermined pattern by the formation of a mask pattern by photolithography and an etching process using the mask pattern.

By the wire, particular elements can be connected. This wire bends in a rectangle (called a bent part) due to limitation of the layout and does not connect particular elements with a straight line. In addition, the width of the wire changes in an opening or in another region. For example, in the opening, the width of the wire is widened in the portion in a case where the opening has about the same width or is wider than the width of the wire. Further, since the wire serves as one electrode of a capacitor due to the layout of the circuit, the wire may be designed to have a wide line width.

Figure 8:
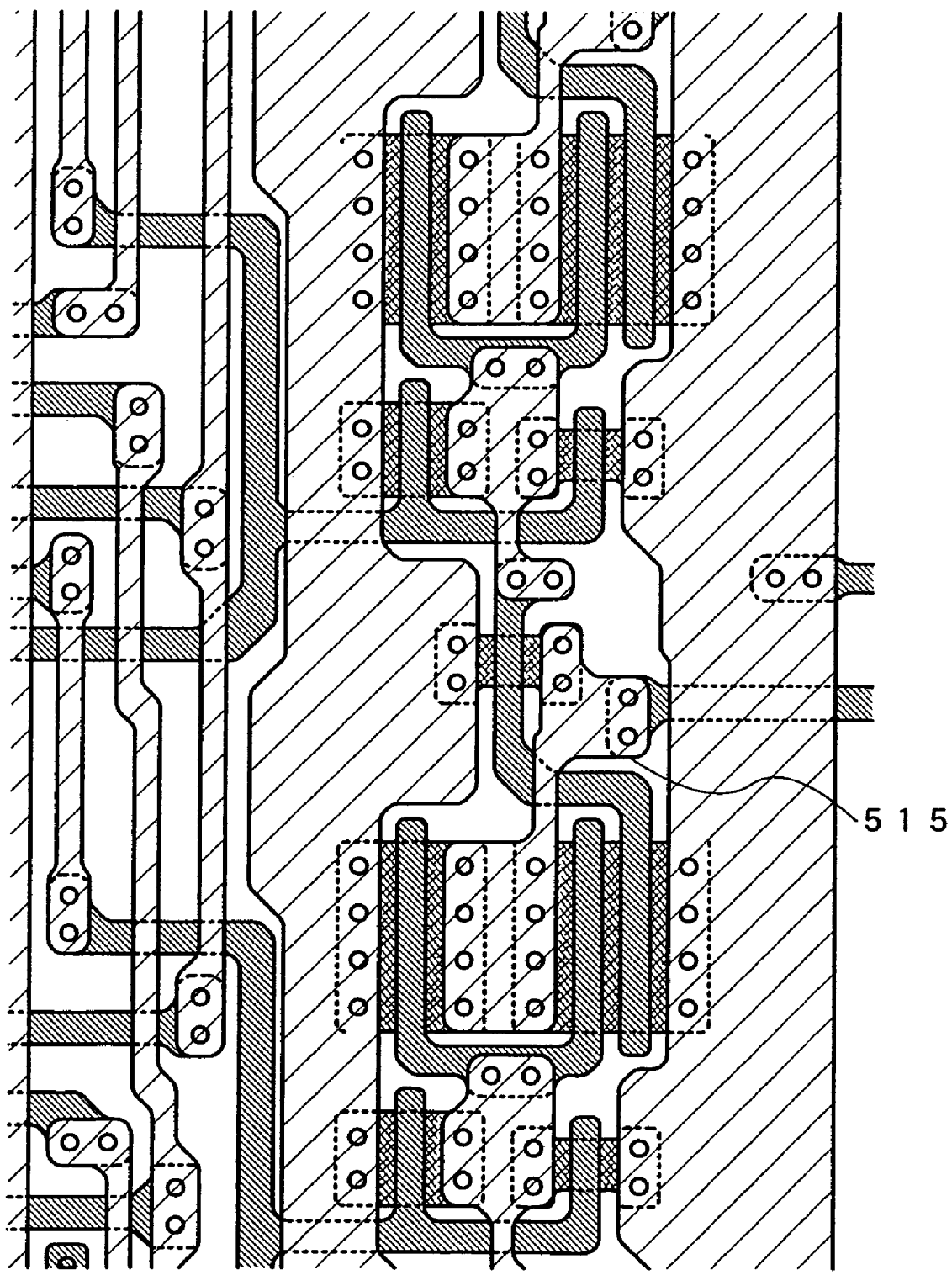
FIG. 8 shows a layout of a circuit that a wireless chip of the present invention has.

In this case, at the bent part of the pattern of the photomask, a corner is removed. The corner to be removed (right triangle) has two sides forming a right angle and each side is 10 μm or shorter, or a half or less and a fifth or more of a line width of the wire. In a case where a shape of the corner to be removed is not a right angle (right triangle), a condition of two sides forming a corner which is desired to be removed may satisfy the above-mentioned condition. Then, as shown in FIG. 8, a pattern of the electrode (the wire) 515 may be rounded similarly. A corner of the wire is removed by a half or less and a fifth or more of a line width, so that a bent part can be rounded. In the case of dry etching using plasma at a projecting portion in the bent part, the generation of fine particles by abnormal electrical discharge can be suppressed by using such a rounded wire. At a depressed portion, even when fine particles are generated, it can be washed away easily in washing. Accordingly, there is an effect that yield is expected to be drastically improved. Since the corner of the wire is rounded, and smooth electrical conduction is expected without delay of the charge flow, a problem that an electric field is concentrated on a corner to cause short-circuit can be reduced.

In a circuit having the layout which is shown in FIG. 8, a portion of a corner in which the bent part or the line width is changed is smoothed and rounded, so that in the case of dry etching using plasma, the generation of fine particles by abnormal electrical discharge can be suppressed, and even when fine particles are generated, they can be washed away easily in washing. Accordingly, there is an effect that yield is expected to be drastically improved. That is, a problem such as dust or fine particles in a manufacturing process can be solved. In addition, since a structure in which the corner of the wire is rounded is used, and smooth electrical conduction is expected without delay of the charge flow. In particular, in a wire such as a driver circuit portion in which a lot of parallel wires are provided, it is extremely convenient to enable dust to be washed away.

Note that in this embodiment mode, description is made of the mode in which the corner or the bent part is rounded in three layouts of the semiconductor layer, the gate wire, and the wire; however, the present invention is not limited to these. That is, in either one of the layers, the corner or the bent part is only required to be rounded, so that a problem such as dust or fine particles in a manufacturing process may be solved.

Figure 13:
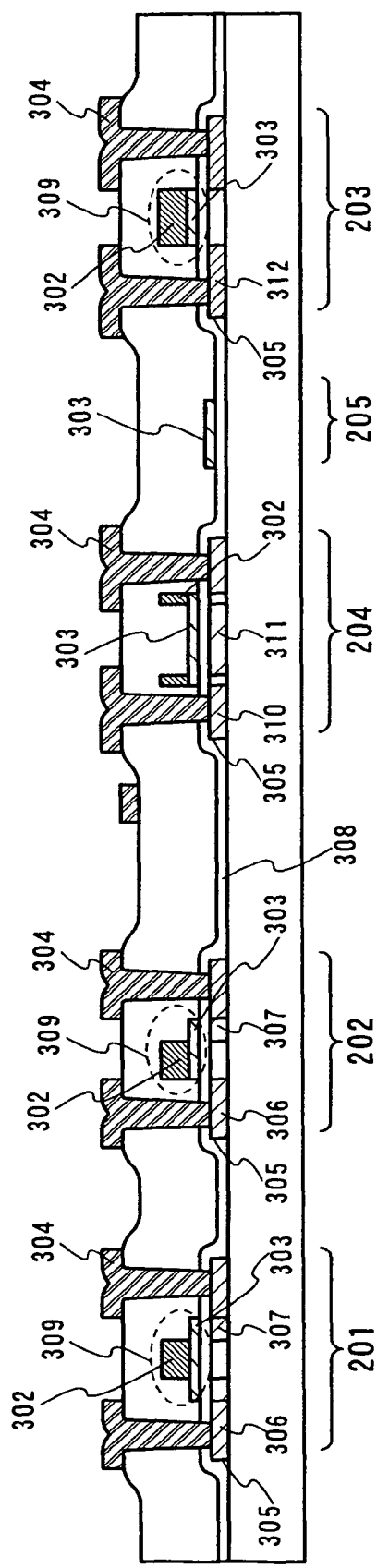
FIG. 13 shows a cross section of a circuit that a wireless chip of the present invention has.

Next, described are a transistor, a capacitor, and a resistor which are used for a circuit of a wireless chip. First, description is made of these cross-sectional structures with reference to FIG. 13. FIG. 13 shows an N-channel TFT 201, an N-channel TFT 202, a capacitor 204, a resistor 205, and a P-channel TFT 203. Each transistor can be formed of a semiconductor layer 305, an insulating layer 308, a gate electrode 309, and the like. The gate electrode 309 is formed with a stacked-layer structure of a first conductive layer 303 and a second conductive layer 302. Further, FIGS. 14A to 14E are top views corresponding to the transistor, the capacitor, and the resistor shown in FIG. 13, and can be referred to in conjunction with FIG. 13.

In FIG. 13, an impurity region 307 doped with impurities at a lower concentration than that of an impurity region 306 which serves as a source region or a drain region and having a contact with a wire 304 is formed in the semiconductor layer 305 of the N-channel TFT 201 in a channel length direction (a direction in which a carrier flows). This impurity region doped with impurities at a lower concentration is also called a low concentration drain (LDD), and is formed on both sides of the gate electrode in the N-channel TFT 201. Phosphorus or the like is added into the impurity region 306 and the impurity region 307 as an impurity imparting N-type conductivity in a case of forming the N-channel TFT 201. The LDD is formed as a means of suppressing deterioration by the hot electron and short channel effect.

Figure 14A:
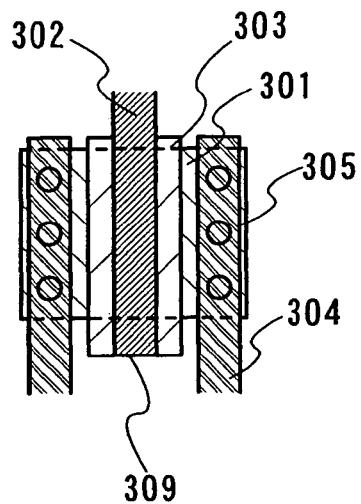
FIGS. 14A to 14E are top views showing a transistor, a capacitor, or a resistor of a circuit that a wireless chip of the present invention has.

The first conductive layer 303 is formed so as to spread out on both sides of the second conductive layer 302 in the gate electrode 309 of the N-channel TFT 201, as shown in FIG. 14A. In this case, the first conductive layer 303 is formed thinner than the second conductive layer. The first conductive layer 303 is formed with a thickness capable of passing ion species accelerated with an electric field of 10 to 100 kV. The impurity region 307 is formed so as to overlap with the first conductive layer 303 of the gate electrode 309. That is, an LDD region overlapping with the gate electrode 309 is formed. This structure is formed in a self-aligning manner by adding a one conductive type impurity through the first conductive layer 303 with the second conductive layer 302 as a mask. That is, the LDD overlapping with the gate electrode is formed in a self-aligning manner.

A transistor having an LDD on both sides is applied to a rectifying TFT of the power supply circuit 703 or a transistor forming a transmission gate (also called an analog switch) which is used for a logic circuit in FIG. 1. An LDD is preferably provided on both sides of a gate electrode for these TFTs, since both positive and negative voltages are applied to a source electrode or a drain electrode.

Figure 14B:
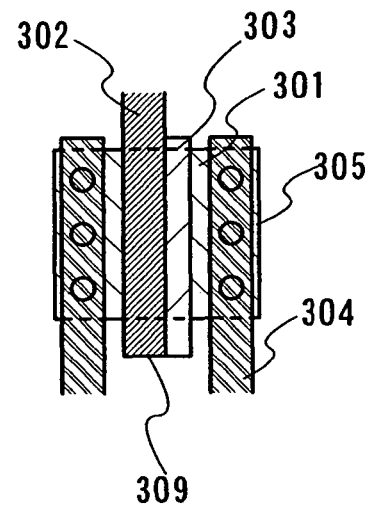

In FIG. 13, on one side of the gate electrode, the impurity region 307 doped with impurities at a lower concentration than that of the impurity region 306 is formed in the semiconductor layer 305 of the N-channel TFT 202. The first conductive layer 303 is formed so as to spread out on one side of the second conductive layer 302 in the gate electrode 309 of the N-channel TFT 202, as shown in FIG. 14B. Similarly in this case, a one conductive type impurity is added through the first conductive layer 303 with the second conductive layer 302 as a mask, so that the LDD can be formed in a self-aligning manner.

A transistor having an LDD on one side may be applied to a transistor to which either only a positive voltage or only a negative voltage is applied between a source electrode and a drain electrode. Specifically, such a transistor may be applied to a transistor forming a logic gate such as an inverter circuit, a NAND circuit, a NOR circuit or a latch circuit, or to a transistor forming an analog circuit such as a sense amplifier, a constant voltage generating circuit, or a VCO.

Figure 14C:
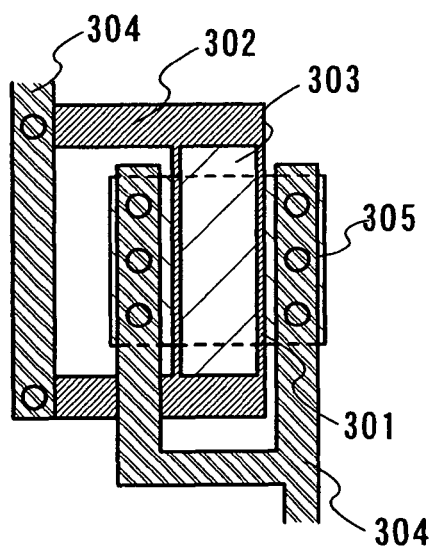
Figure 14D:
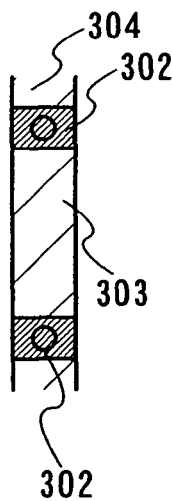
Figure 14E:
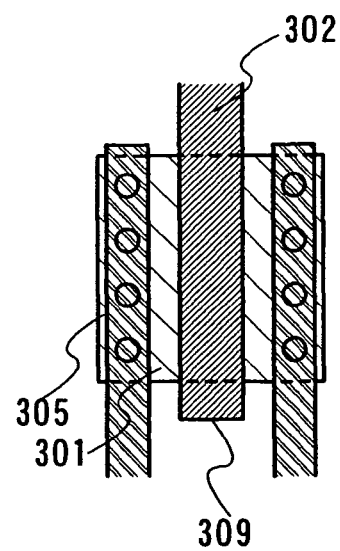

In FIG. 13, the capacitor 204 is formed with the insulating layer 308 sandwiched between the first conductive layer 303 and the semiconductor layer 305. The semiconductor layer 305 forming the capacitor 204 has an impurity region 310 and an impurity region 311. The impurity region 311 is formed in the semiconductor layer 305 at a position overlapping with the first conductive layer 303. Further, the impurity region 310 is connected to the wire 304. Since the impurity region 311 can be doped with a one conductive type impurity through the first conductive layer 303, the impurity concentration of the impurity region 310 and the impurity region 311 can be made different. Alternatively, it can be made the same impurity concentration. In any event, since the semiconductor layer 305 functions as an electrode in the capacitor 204, it is preferable that a one conductive type impurity be added to be low resistance. Further, the second conductive layer 302 is used as an auxiliary electrode, as shown in FIG. 14C; therefore, the first conductive layer 303 can function well as an electrode. In this manner, a composite electrode structure combining the first conductive layer 303 and the second conductive layer 302 is used, so that the capacitor 204 can be formed in a self-aligning manner.

In FIG. 1, a capacitor is used as a storage capacitor that the power supply circuit 703 has, or as a resonant capacitor that the resonance circuit 702 has. In particular, both positive and negative voltages are applied between two terminals of the capacitor, so that the resonant capacitor is required to function as a capacitor without depending on the both positive and negative voltages between two terminals.

In FIG. 13, the resistor 205 is formed of the first conductive layer 303. The first conductive layer 303 is formed with a thickness of about 30 to 150 nm, so the width, the length, the thickness, a material thereof, and the like are set appropriately so that the resistor can be formed.

A resistor is used as a resistance load that the modulation circuit 709 has in FIG. 1. Further, there is a case where the resistor is used as a load when a current is controlled by a VCO (Voltage Controlled Oscillator) or the like. The resistor may be formed of a semiconductor layer including an impurity element at high concentration or of a metal layer. The resistance of the semiconductor layer depends on the film thickness, film quality, impurity concentration, an activation rate, or the like, while the resistance of the metal layer is determined by the film thickness and film quality, so variation is small and preferable.

In FIG. 13, the P-channel TFT 203 has an impurity region 312 in the semiconductor layer 305. The impurity region 312 forms a source region and a drain region each of which has a contact with the wire 304. The gate electrode 309 has a structure in which the first conductive layer 303 overlaps with the second conductive layer 302. The P-channel TFT 203 is a transistor having a single drain structure which does not have an LDD. In a case of forming the P-channel TFT 203, boron or the like is added as an impurity imparting P-type conductivity into the impurity region 312. On the other hand, when phosphorus is added into the impurity region 312, an N-channel transistor having a single drain structure can be formed.

Similarly to the memory element shown in the aforementioned embodiment mode, a high-density plasma treatment process can be applied to one or both of the semiconductor layer 305 and the insulating layer 308.

As described with reference to FIGS. 13 and 14A to 14E, various structural elements can be formed by combining conductive layers having different thickness. A region where only the first conductive layer is formed and a region where the first conductive layer and the second conductive layer are stacked can be formed by using a photomask or a reticle having an auxiliary pattern which is formed of a diffraction grating pattern or a semi-transmissive film having a function of reducing the light intensity. That is, when the photoresist is exposed to light in a photolithography process, the amount of light passing through the photomask is regulated so that resist masks developed have different thicknesses. In this case, a photomask or a reticle is provided with a slit of resolution limitation or less, and a resist having the aforementioned complicated shape may be formed. Further, a mask pattern which is formed of a photoresist material may be transformed by baking at about 200° C. after developing.

Further, by using the photomask or the reticle having an auxiliary pattern which is formed of the diffraction grating pattern or the semi-transmissive film having the function of reducing the light intensity, a region where only the first conductive layer is formed and a region where the first conductive layer and the second conductive layer are stacked can be formed in succession. As shown in FIG. 14A, the region where only the first conductive layer is formed can be formed selectively over a semiconductor layer. Such a region is effective over the semiconductor layer; however, it is not required in a region (a wire region continuous with a gate electrode) other than the semiconductor layer. By using this photomask or reticle, a region which has only the first conductive layer is not required to be formed in a wire portion, so that the density of the wire can be increased substantially.

In the case of FIGS. 13 and 14A to 14E, the first conductive layer is formed to have a thickness of 30 to 50 nm by using a high melting point metal such as tungsten (W), chromium (Cr), tantalum (Ta), tantalum nitride (TaN), or molybdenum (Mo), or an alloy or compound including the high melting point metal as its main component. In addition, the second conductive layer is formed to have a thickness of 300 to 600 nm by using a high melting point metal such as tungsten (W), chromium (Cr), tantalum (Ta), tantalum nitride (TaN), or molybdenum (Mo), or an alloy or compound including the high melting point metal as its main component. For example, the use of different conductive materials for each of the first conductive layer and the second conductive layer results in a difference in etching rate in an etching process to be carried out later. As an example, TaN can be used as the first conductive layer, and a tungsten film can be used as the second conductive layer. Note that the present invention is not limited to this, and another material (for example, an element selected from among titanium (Ti), aluminum (Al), gold (Au), silver (Ag), copper (Cu), platinum (Pt), niobium (Nb), and neodymium (Nd), or an alloy material or compound material having the aforementioned element as its main component, or the like) may be used.

In addition, in a case where a stacked-layer structure with the first conductive layer and the second conductive layer is used to form a gate wire, patterning may be performed so as to meet both ends thereof. Accordingly, a fine gate wire can be formed.

This embodiment mode shows that by using the photomask or the reticle having the auxiliary pattern which is formed of the diffraction grating pattern or the semi-transmissive film having the function of reducing the light intensity, a transistor, a capacitor, and a resistor with a different electrode structure can be separately formed by the same patterning process. Accordingly, in accordance with a property of a circuit, elements with different forms can be formed and integrated without increasing the process. Needless to say, the present invention is not limited to the aforementioned method, and a conductive layer may be formed in a desired shape by a method in which film formation and etching are repeated alternately.

Note that this embodiment mode can be implemented by freely combining with Embodiment Mode 1 to Embodiment Mode 3.

Embodiment 1

In this embodiment, description is made of an embodiment of a case where a plurality of wireless chips is attached to a facility.

Figure 9:
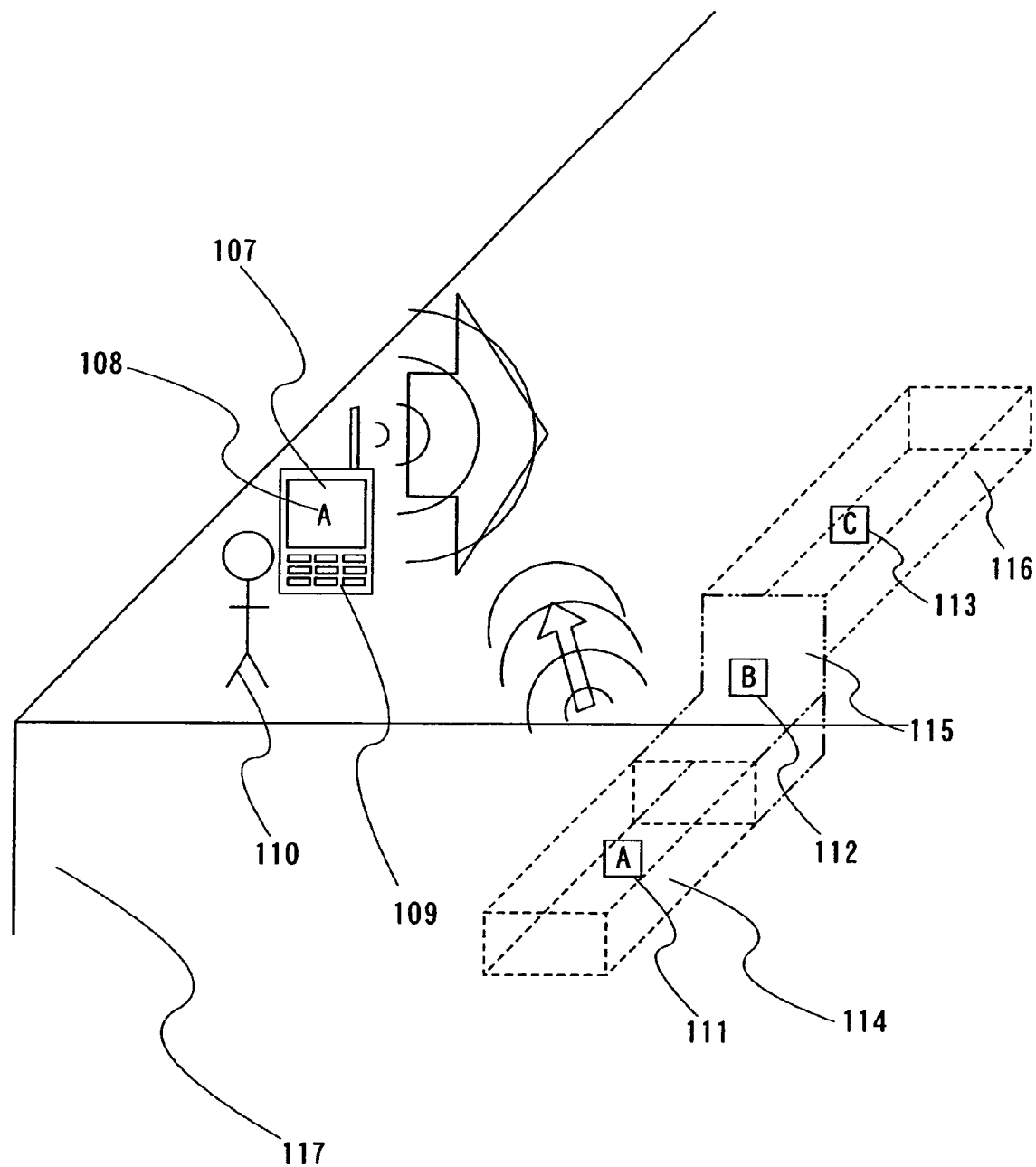
FIG. 9 shows a communication mode using a wireless chip and a reader/writer of the present invention.

As shown in FIG. 9, at a stage before construction of a facility to be buried in an underground 117, a wireless chip (A) 111, a wireless chip (B) 112, and a wireless chip (C) 113 in which data required for construction is stored in a memory circuit 104 in advance are attached to the facility. Then, construction is performed. Alternatively, the wireless chip (A) 111 in which data in construction is not stored is attached to the facility. Then, after performing construction, required data is stored therein.

When checking, maintaining, managing, or grasping a buried facility, or the like, a reader/writer 109 is prepared and activated, so that a particular wireless chip, for example, the wireless chip (A) 111, is searched. When the wireless chip (A) 111 is searched, the communication for transmitting key data corresponding to the wireless chip (A) 111 is performed by the reader/writer 109 so that a location of the wireless chip (A) 111 or the like can be displayed on a display portion 107 of the reader/writer or the like (108).

Moreover, when the reader/writer 109 communicates with the wireless chip (A) 111, the reader/writer 109 exchanges data with an internal data processor or an external data processor (a server or the like) so that detailed data which is associated with a buried object can be obtained. For example, a large amount of data that the wireless chip (A) 111 cannot store, which is related to a buried object such as documents including peripheral map data, a photograph at embedding time, or workers, is transmitted/received to/from the reader/writer 109, and by displaying the data on the display portion 107, required data can be obtained immediately on the spot. Note that the data processor in the reader/writer is not required to have a storage device; however, it is preferable to have a structure having a storage device.

Figure 10:
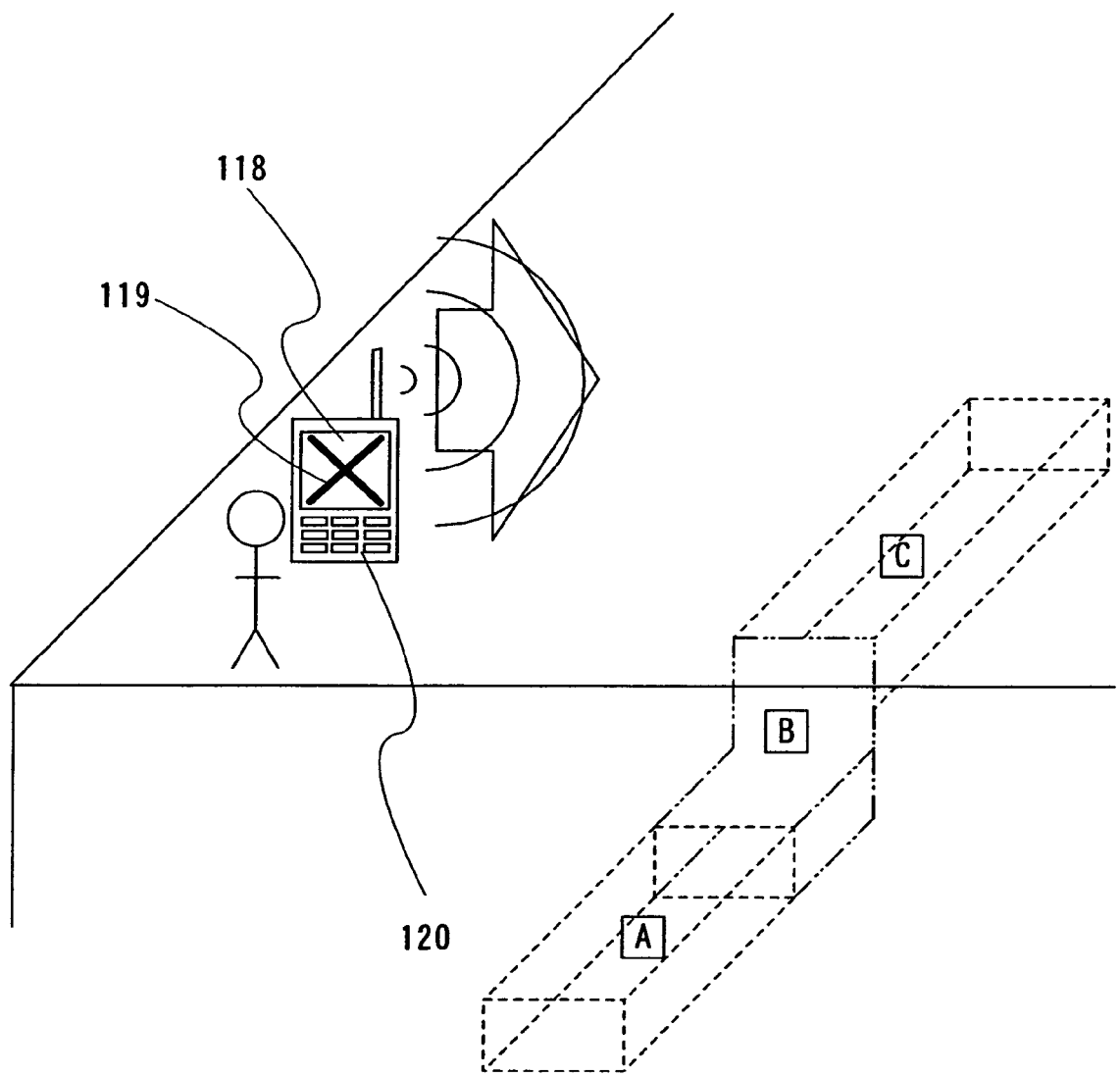
FIG. 10 shows a communication mode using a wireless chip and a reader/writer of the present invention.

Needless to say, in a case where there is no a wireless chip corresponding to key data emitted from a reader/writer (for example, in a case where the reader/writer emits key data corresponding to a wireless chip (D) which does not exist), reaction from the wireless chip (the wireless chip (D)) corresponding to the key data cannot be obtained as shown in FIG. 10. Therefore, on a display portion of the reader/writer, the effect that a particular wireless chip cannot be searched can be displayed.

Similarly, the communication for transmitting key data corresponding to the wireless chip (B) 112 and the wireless chip (C) 113 is performed so that a data exchange with the wireless chip (B) 112 and the wireless chip (C) 113 can be performed.

By such present invention, data from the wireless chip (A) 111 or data of the data processor that the reader/writer 109 has can be displayed on the display portion 107 so that check operation can be facilitated. In particular, a worker is not required to bring many documents with him, and preferable.

Figure 11:
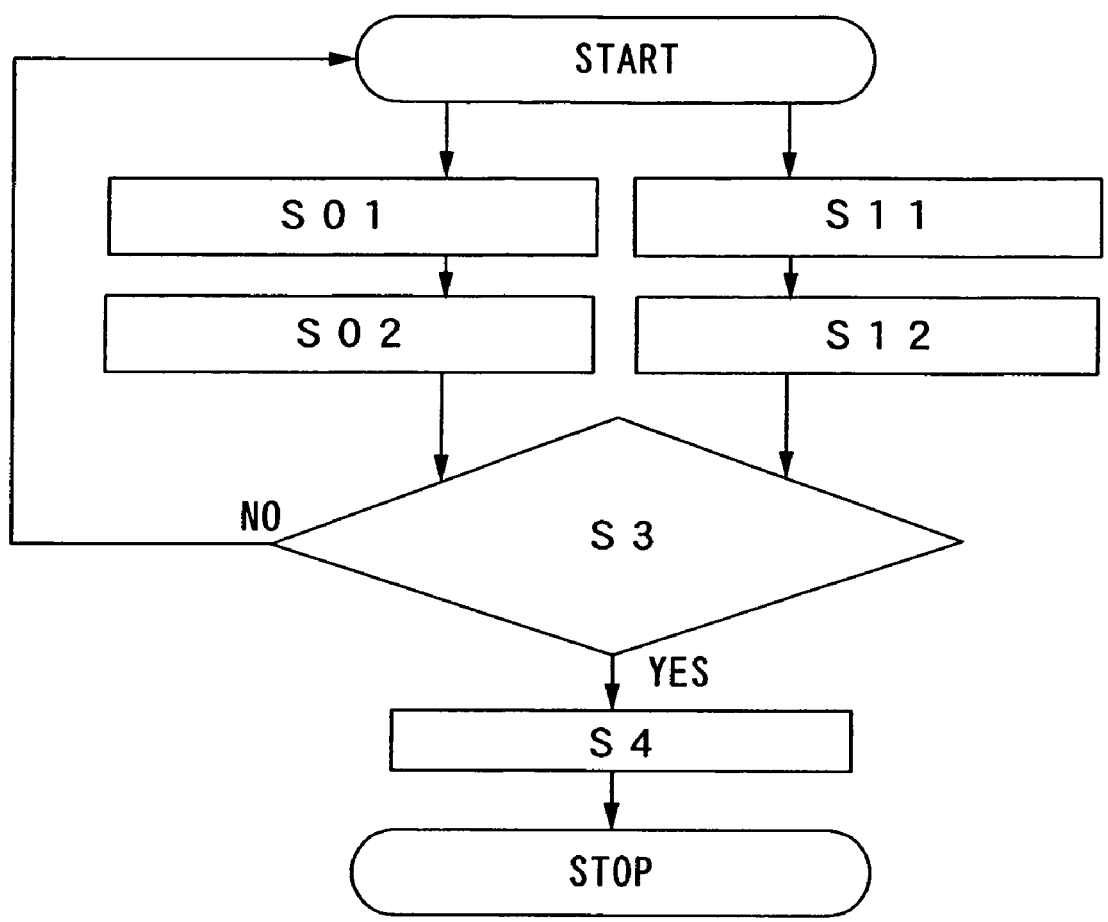
FIG. 11 is a flow chart showing a flow of a management system of the present invention.

FIG. 11 shows a flow chart for expressing a flow to write data into a wireless chip. First, data is written into the wireless chip (S01), and after that, the wireless chip is attached to a facility (S02). Alternatively, the wireless chip is attached to the facility first (S11), and after that, data may be written into the wireless chip (S12). Then, whether data required for the wireless chip, for example, initial data is written, is checked by the reader/writer (S3). In a case where data is written (YES), construction such as construction is performed, and a facility is completed (S4). In addition, in a case where the data is not written (NO), the data writing process goes back to the first step again.

Figure 12:
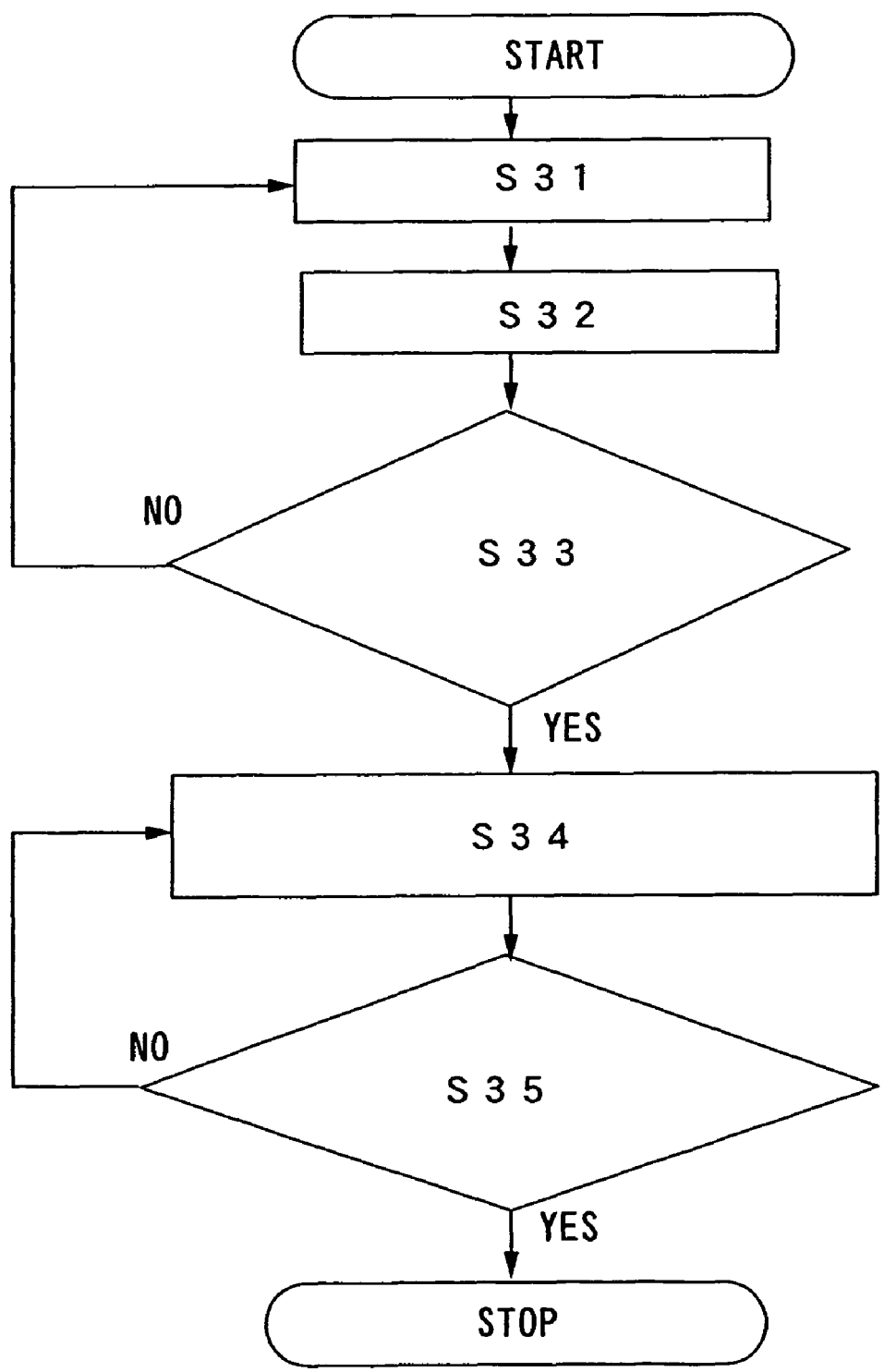
FIG. 12 is a flow chart showing a flow of a management system of the present invention.

Next, by using a flow chart shown in FIG. 12, a workflow at the time of check is described. First, a reader/writer is prepared (S31). That is, a worker brings a reader/writer with him on the spot. Such a reader/writer is preferably a portable type. Then, the reader/writer is activated and a wireless chip is searched (S32). At this time, when setting of key data is performed by a CPU of the wireless chip or the like, the presence of reaction from a particular wireless chip is checked with the reader/writer, so that the wireless chip can be specified (S33). In a case where there is the specified wireless chip (YES), the reader/writer chooses the data required from the data processor (a storage device and the like). The data processor (the storage device and the like) may be provided inside the reader/writer or outside thereof. In a case where the required data has a large volume, the required data may be downloaded from a server (an external data processor) (S34). In addition, in a case where the wireless chip cannot be specified (NO), the flow returns to the start. After that, these pieces of data are written into the wireless chip (S35). In a case where writing can be performed (YES), the flow is finished, in a case where writing cannot be performed (NO), the check process goes back to the start again.

In this manner, the wireless chip of the present invention has a wireless communication function, so that a data exchange with a buried facility, that is, a buried wireless chip can be performed. In the present invention, by attaching a wireless chip to each buried object itself, data such as embedded date, position data, or an owner can be written into a memory circuit of the wireless chip; therefore, in maintenance, a check or additional work, presence of each person in charge or digging up the land surface excessively as is conventionally done is not required, which leads to lower cost or shorter time. In addition, in a case where there is a large mount of data which exceeds a memory capacity of a memory of the wireless chip, such a large mount of data may be associated with data stored in the memory of the wireless chip and stored in a server and the like. As set forth above, a large mount of data can be appropriately downloaded into a reader/writer, and read.

In addition, since a stake is not required to be provided by the present invention, a ground can be flattened, and a land can be effectively used.

Moreover, a CPU is mounted on a wireless chip, so that only a terminal having an encryption function which has obtained permission of communication can communicate, and access by unspecified number of devices, leakage of position data or the like, an erasure of stored data, rewriting or the like can be prevented.

Furthermore, a reader/writer has a function of being connected to a data processor (a storage device, a server or the like) by using a data-communications network such as a mobile phone and the like, so that data that a stake cannot display can be obtained. For example, a large amount of data, which cannot be stored in a wireless chip, such as a construction photograph or each work document can be obtained.

The present invention provides a facility data management system which can obtain an enormous amount of data on buried objects easily, promptly and surely on site. Moreover, maintenance, a check, or additional work can be performed without the presence of a worker, which leads to shorter time or lower labor cost.

This application is based on Japanese Patent Application serial no. 2005-160904 filed in Japan Patent Office on Jun. 1st, 2005, the entire contents of which are hereby incorporated by reference.

What is claimed is:

1. A data management method comprising the steps of:
downloading second data from a server into a reader/writer;
writing the second data into a memory contained in a wireless chip by using the reader/writer wherein the wireless chip is buried and the memory includes first data;
sending a key data to the wireless chip after burying;
encrypting the first data using the key data, in the wireless chip;
receiving the first data from the wireless chip after encrypting; and
decrypting the first data using the key data after receiving; and
downloading third data from the server associated with the first data read from the wireless chip into the reader/writer wherein an amount of the third data is larger than an amount of data which is capable of being stored in the memory of the wireless chip,
wherein the memory is a write-once memory comprising an organic material.

2. The data management method according to claim 1, wherein the wireless chip is attached to a managed object.

3. The data management method according to claim 1, wherein the wireless chip is buried under the ground.

4. The data management method according to claim 1, further comprising the step of sending the first data to a data processor after decrypting the first data.

5. The data management method according to claim 1, wherein the write-once memory comprises a thin film transistor formed over a substrate, a first electrode electrically connected to one of a source and a drain of the thin film transistor, a second electrode opposed to the first electrode and a memory material layer interposed between the first electrode and the second electrode.

6. A data management method comprising the steps of:
downloading second data from a server into a reader/writer;
writing the second data into a memory contained in a wireless chip by using the reader/writer wherein the wireless chip is buried and the memory includes first data;
sending a public key data to the wireless chip after burying;
encrypting the first data using the public key data, in the wireless chip;
receiving the first data from the wireless chip after encrypting; and
decrypting the first data using a private key data after receiving; and
downloading third data from the server associated with the first data read from the wireless chip into the reader/writer wherein an amount of the third data is larger than an amount of data which is capable of being stored in the memory of the wireless chip,
wherein the memory is a write-once memory comprising an organic material.

7. The data management method according to claim 6, wherein the wireless chip is attached to a managed object.

8. The data management method according to claim 6, wherein the wireless chip is buried under the ground.

9. The data management method according to claim 6, further comprising the step of sending the first data to a data processor after decrypting the first data.

10. The data management method according to claim 6, wherein the write-once memory comprises a thin film transistor formed over a substrate, a first electrode electrically connected to one of a source and a drain of the thin film transistor, a second electrode opposed to the first electrode and a memory material layer interposed between the first electrode and the second electrode.

11. A data management method comprising the steps of:
downloading second data from a server into a reader/writer:
writing the second data into a memory contained in one of a plurality of wireless chips by using the reader/writer wherein the plurality of wireless chips is buried and one of the plurality of wireless chips includes first data in the memory and a key data;
sending the key data to the plurality of wireless chips after burying;
encrypting the first data using the key data, in the written one of the plurality of wireless chips;
receiving the first data from the written one of the plurality of wireless chips, after encrypting; and
decrypting the first data using the key data after receiving; and
downloading third data from the server associated with the first data read from one of the plurality of wireless chips into the reader/writer wherein an amount of the third data is larger than an amount of data which is capable of being stored in the memory of one of the plurality of wireless chips,
wherein the memory is a write-once memory comprising an organic material.

12. The data management method according to claim 11, wherein the plurality of wireless chips is attached to a managed object.

13. The data management method according to claim 11, wherein the plurality of wireless chips is buried under the ground.

14. The data management method according to claim 11, further comprising the step of sending the first data to a data processor after decrypting the first data.

15. The data management method according to claim 11, wherein the write-once memory comprises a thin film transistor formed over a substrate, a first electrode electrically connected to one of a source and a drain of the thin film transistor, a second electrode opposed to the first electrode and a memory material layer interposed between the first electrode and the second electrode.

16. A data management method comprising the steps of:
downloading second data from a server into a reader/writer;
writing the second data into a memory contained in one of a plurality of wireless chips wherein the plurality of wireless chips is buried and one of the plurality of wireless chips includes first data in the memory and a public key data;
sending the public key data to the plurality of wireless chips after burying;
encrypting the first data using the public key data, in the written one of the plurality of wireless chips;
receiving the first data from the written one of the plurality of wireless chips, after encrypting; and
decrypting the first data using a private key data after receiving; and
downloading third data from the server associated with the first data read from one of the plurality of wireless chips into the reader/writer wherein an amount of the third data is larger than an amount of data which is capable of being stored in the memory of one of the plurality of wireless chips,
wherein the memory is a write-once memory comprising an organic material.

17. The data management method according to claim 16, wherein the plurality of wireless chips is attached to a managed object.

18. The data management method according to claim 16, wherein the plurality of wireless chips is buried under the ground.

19. The data management method according to claim 16, further comprising the step of sending the first data to a data processor after decrypting the first data.

20. The data management method according to claim 16, wherein the write-once memory comprises a thin film transistor formed over a substrate, a first electrode electrically connected to one of a source and a drain of the thin film transistor, a second electrode opposed to the first electrode and a memory material layer interposed between the first electrode and the second electrode.

* * * * *